US012677385B2

(12) United States Patent
Park et al.

(10) Patent No.: US 12,677,385 B2
(45) Date of Patent: Jul. 7, 2026

(54) DISPLAY DEVICE

(71) Applicant: Samsung Display Co., LTD., Yongin-si (KR)

(72) Inventors: Boik Park, Yongin-si (KR); Taewoong Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 214 days.

(21) Appl. No.: 18/224,400

(22) Filed: Jul. 20, 2023

(65) Prior Publication Data

US 2024/0130060 A1 Apr. 18, 2024

(30) Foreign Application Priority Data

Oct. 14, 2022 (KR) ........................ 10-2022-0132248

(51) Int. Cl.
H05K 5/02 (2006.01)
H10K 59/80 (2023.01)

(52) U.S. Cl.
CPC ........... H05K 5/0217 (2013.01); H10K 59/80 (2023.02)

(58) Field of Classification Search
CPC ........................... H05K 5/0017; H05K 5/0217
USPC ........................................................ 361/807
See application file for complete search history.

(56) References Cited

U.S. PATENT DOCUMENTS

| | | | |
|---|---|---|---|
| 8,188,509 B2 | 5/2012 | Lee | |
| 10,274,995 B2 | 4/2019 | Seo et al. | |
| 10,809,552 B2 | 10/2020 | Park et al. | |
| 2015/0047796 A1* | 2/2015 | Peng | ........................ G09F 11/34 |
| | | | 160/323.1 |
| 2017/0270835 A1* | 9/2017 | Yang | .................... H10K 77/111 |
| 2018/0375054 A1* | 12/2018 | Wang | ................... H10K 59/873 |
| 2019/0036025 A1* | 1/2019 | Nishida | ............... H10K 71/166 |
| 2021/0185844 A1* | 6/2021 | Yang | .................... H05K 7/1429 |
| 2022/0264754 A1 | 8/2022 | Kim et al. | |
| 2022/0269312 A1 | 8/2022 | Choi et al. | |
| 2022/0322550 A1* | 10/2022 | Yin | ........................ H05K 5/0217 |

FOREIGN PATENT DOCUMENTS

| | | | | |
|---|---|---|---|---|
| CN | 202486472 U | * 10/2012 | ............. | G02F 1/133 |
| KR | 1020110054768 A | 5/2011 | | |
| KR | 1020150075604 A | 7/2015 | | |
| KR | 1020180025358 A | 3/2018 | | |
| KR | 1020190065852 A | 6/2019 | | |
| KR | 1020210041665 A | 4/2021 | | |
| KR | 1020220117373 A | 8/2022 | | |
| WO | WO-2022119234 A1 | * 6/2022 | ........... | G06F 1/1624 |

* cited by examiner

*Primary Examiner* — Hung S. Bui
(74) *Attorney, Agent, or Firm* — CANTOR COLBURN LLP

(57) ABSTRACT

A display device includes a display module and a module support part disposed on one surface of the display module, where the module support part may include a support layer disposed on one surface of the display module, a support disposed in the support layer and having greater rigidity than the support layer, and a magnetic particle layer disposed above or under the support in the support layer. A method of manufacturing a module support part may include preparing a support, providing a suspension including a plurality of magnetic particles to the support, aligning the plurality of particles by applying a magnetic field to the suspension provided to the support, and forming a support layer by curing the suspension.

20 Claims, 30 Drawing Sheets

BUS

MP

SUS

SMP

SPL } MSP

SPP

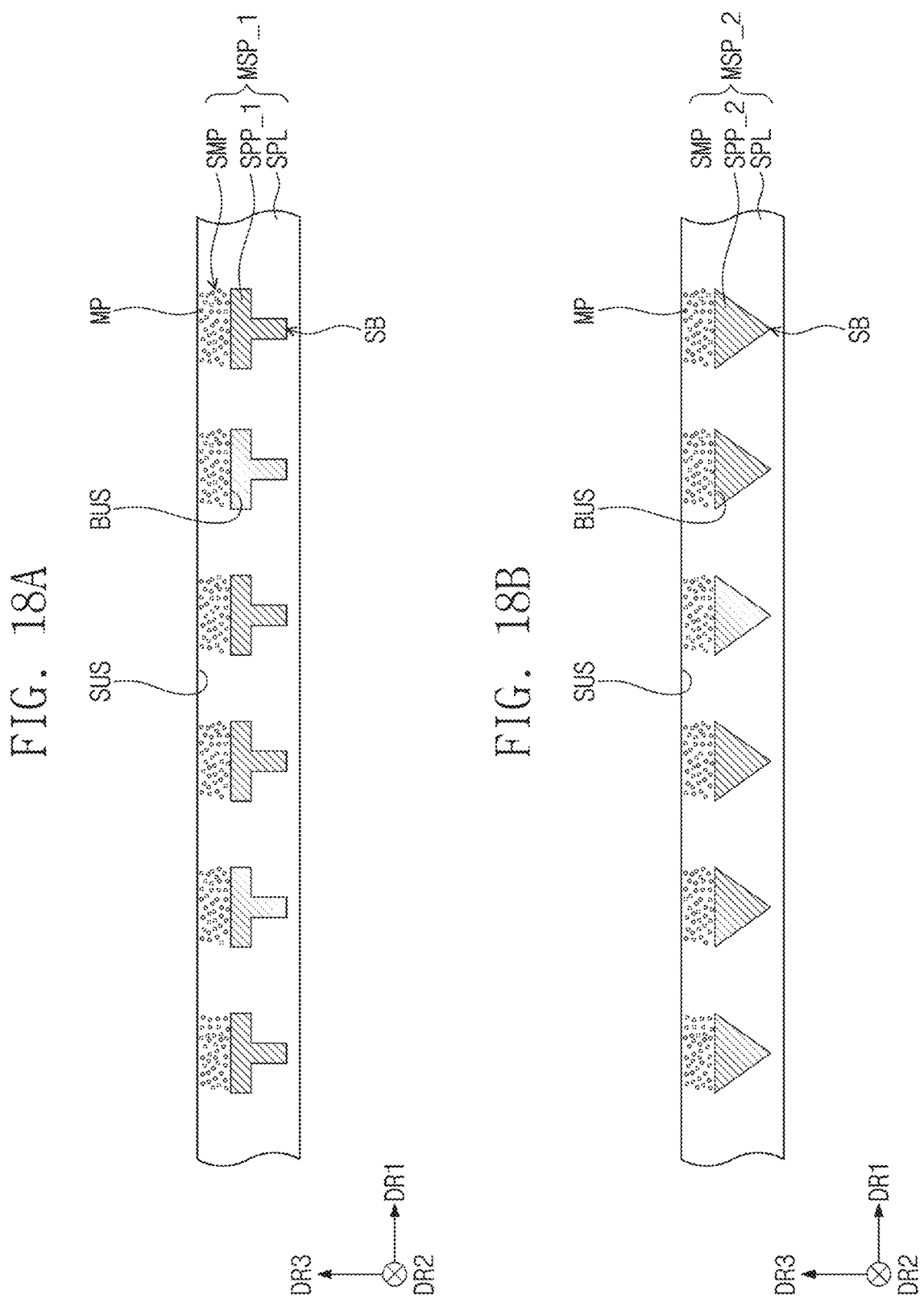

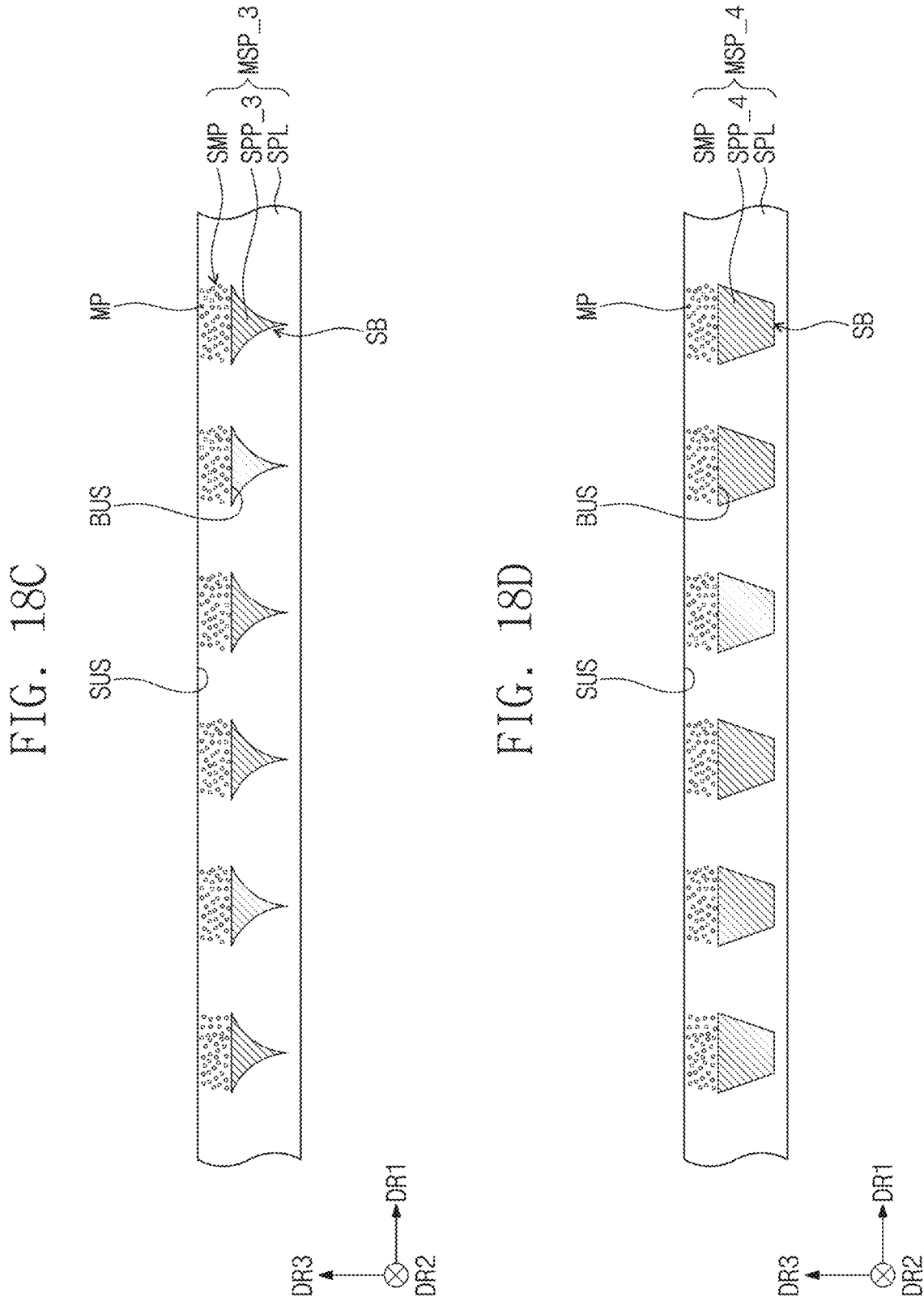

DISPLAY DEVICE

This application claims priority to Korean Patent Application No. 10-2022-0132248, filed on Oct. 14, 2022, and all the benefits accruing therefrom under 35 U.S.C. § 119, the content of which in its entirety is herein incorporated by reference.

BACKGROUND

1. Field

The disclosure herein relates to a display device.

2. Description of the Related Art

Electronic devices that provide images to users, such as a smartphone, a digital camera, a laptop computer, a navigation part, a smart television, and the like, include a display device for displaying images. The display device generates images and provides the images to a user through a display screen.

Recently, various types of display devices are being developed with the technological development of a display device. For example, various flexible display devices, which are deformable into a curved shape or are foldable or rollable, are being developed. Flexible display devices are easy to carry and allow user convenience to be enhanced.

A rollable display device, among the flexible display devices, may include a display module and a module support part disposed under the display module. The module support part under the display module may support the display module.

SUMMARY

In a rollable display device including a display module and a module support part disposed under the display module, it is desired to develop a technology for strengthening the rigidity of the module support part.

The disclosure provides a rollable display device capable of preventing deformation of a module support part to improve the surface quality of a display module and also capable of preventing static electricity.

An embodiment of the invention provides a display device including: a display module; and a module support part disposed on one surface of the display module, where the module support part includes a support layer disposed on one surface of the display module, a support disposed in the support layer and having greater rigidity than the support layer, and a magnetic particle layer disposed above or under the support in the support layer.

In an embodiment of the invention, a method of manufacturing a module support part includes preparing a support, immersing the support in a resin layer including a plurality of magnetic particles, aligning the plurality of particles by applying a magnetic field to the resin layer in which the support is immersed, and curing the support layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 10A and 10B are views illustrating a portion of a module support part and a display module illustrated in FIGS. 3 and 4;

FIGS. 16A to 16G are views illustrating a method of manufacturing a module support part according to an embodiment of the invention;

FIGS. 17A to 17F are views illustrating a method of manufacturing a module support part according to an alternative embodiment of the invention; and FIGS. 18A to 18D are views illustrating support bars according to various embodiments of the invention.

DETAILED DESCRIPTION

Figure 1:
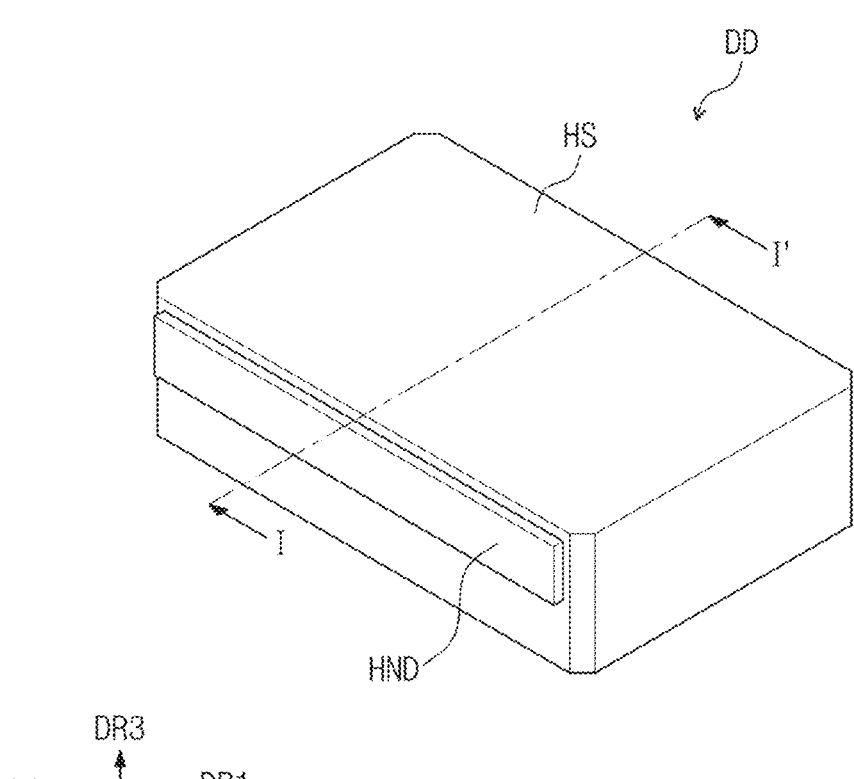
FIG. 1 is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals or symbols refer to like elements throughout.

It will be understood that when an element or a layer is referred to as "being on an upper of" or "being on" another element or layer, it includes not only a case of being directly disposed on another element or layer, but also a case where intervening elements are disposed therebetween. On the contrary, when an element is referred to as "disposing directly on" or "disposing on top", it means that there are no intervening layers or elements therebetween.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The spatially relative terms such as "below", "beneath", "lower", "above", "upper" and the like, may be used herein for ease of description to describe one element or feature's relationship to another element or feature as illustrated in the drawings. It will be understood that the spatially relative terms are intended to encompass different orientations of the device in use or operation in addition to the orientation depicted in the drawings.

It will be understood that, although the terms first, second, etc. may be used herein to describe various elements, components and/or sections, these elements, components and/or sections should not be limited by these terms. These terms are only used to distinguish one element, component, or section from another element, component or section. Thus, a first element, component, or section discussed below could be termed a second element, component, or section without departing from the teachings of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
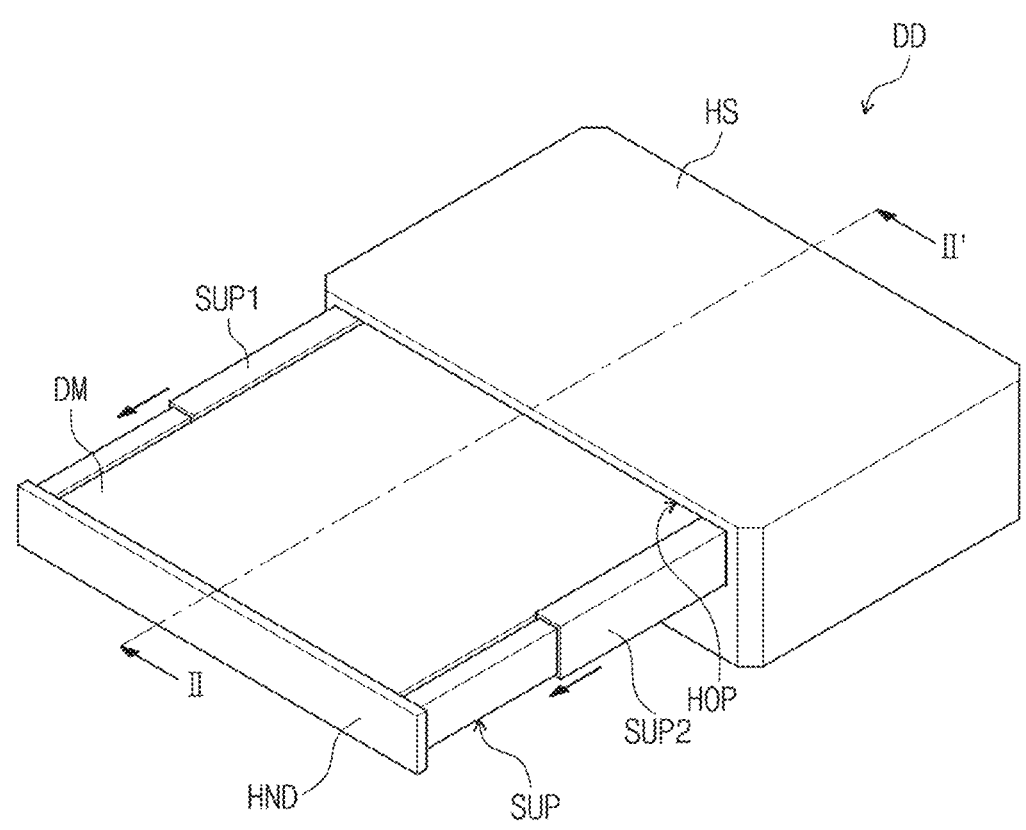
FIG. 2 is a view illustrating a display module drawn out from a housing illustrated in FIG. 1.
Figure 2:
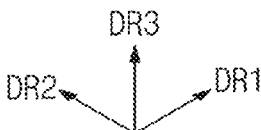

FIG. 1 is a perspective view of a display device according to an embodiment of the invention. FIG. 2 is a view illustrating a display module drawn out from a housing illustrated in FIG. 1.

Referring to FIGS. 1 and 2, a display device DD according to an embodiment of the invention may include a housing HS, a display module DM accommodated in the housing HS, a handle HND connected to the display module DM, and support parts SUP adjacent to opposing sides of the display module DM.

In an embodiment, the housing HS may have a hexahedral shape, but the shape of the housing HS is not limited thereto. The housing HS may extend more (or be longer) in a second direction DR2 crossing a first direction DR1 than in the first direction DR1.

Hereinafter, a direction substantially perpendicular to a plane defined by the first and the second directions DR1 and DR2 is defined as a third direction DR3. In this specification, the wording "when viewed on a plane" may mean a state of being viewed in the third direction DR3.

A housing opening HOP may be defined in one side of opposing sides, of the housing HS, opposed to each other in the first direction DR1. The housing opening HOP may be more adjacent to an upper part of the housing HS than to a lower part of the housing HS.

The display module DM may be drawn in and out through the housing opening HOP by being wound around a roller disposed in the housing HS. However, the embodiment of the invention is not limited thereto, and the display module DM may be drawn out to the outside by sliding from the inside to the outside of the housing HS without using the roller. Hereinafter, for convenience of description, embodiments having the configuration in which the display module DM is wound around the roller will be described in detail below.

The handle HND may be disposed on the outside of the housing HS and be adjacent to the housing opening HOP. The handle HND may be adjacent to an upper part of the housing HS. The handle HND may move in the first direction DR1. When the handle HND moves in the first direction DR1 to be away from the housing HS, the display module DM may be drawn out to the outside of the housing HS through the housing opening HOP. The handle HND may be manipulated by a user.

In an embodiment, a state in which the display module DM is disposed inside the housing HS and is not exposed to the outside as illustrated in FIG. 1 may be defined as a closed mode. In such an embodiment, an operation in which the display module DM is exposed to the outside of the housing HS as illustrated in FIG. 2 may be defined as an open mode. In the open mode, an exposed portion of the display module DM may be expanded.

The support parts SUP may be disposed on opposing sides, of the display module DM, opposed to each other in the second direction DR2 to support the display module DM. The support parts SUP may include a first support part SUP1 adjacent to one side of the display module DM and a second support part SUP2 adjacent to the other side of the display module DM. The one side of the display module DM and the other side of the display module DM may be opposing sides of the display module DM opposed to each other in the second direction DR2.

Figure 3:
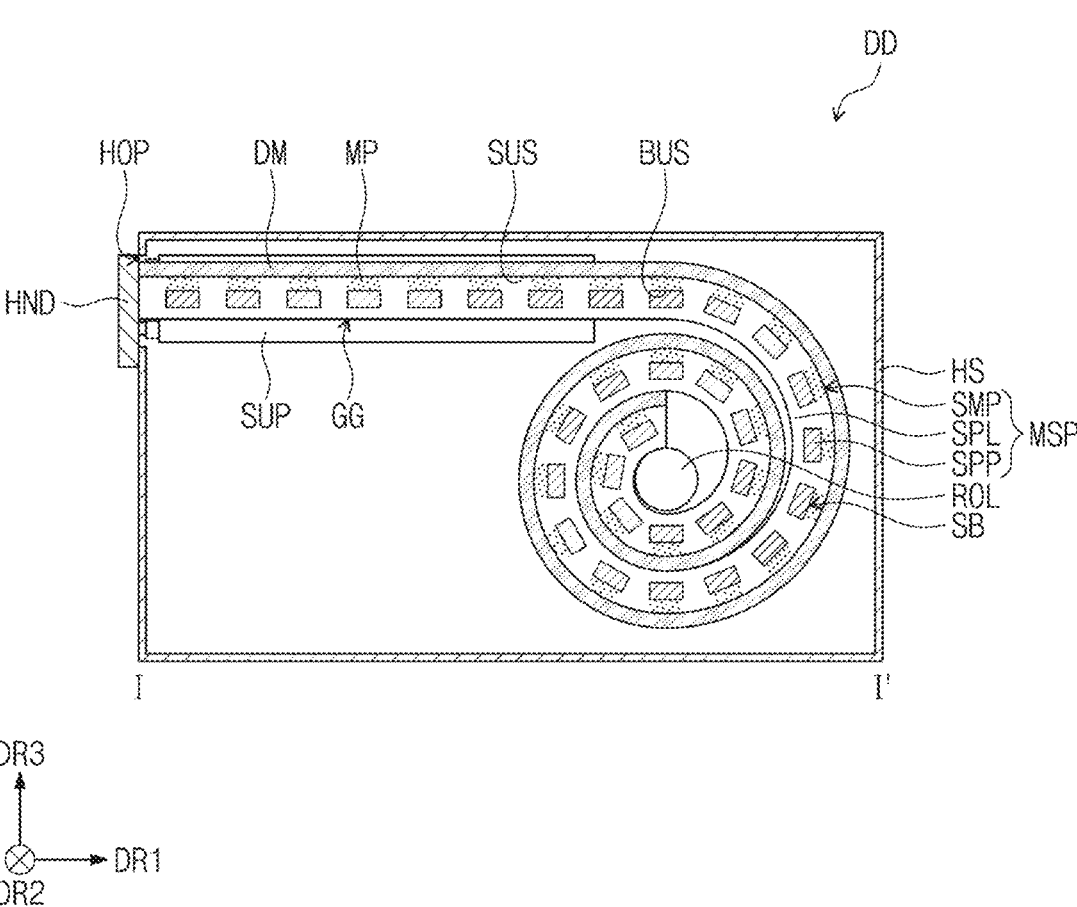
FIG. 3 is a cross-sectional view taken along line I-I' illustrated in FIG. 1.

FIG. 3 is a cross-sectional view taken along line I-I' illustrated in FIG. 1.

Referring to FIG. 3, an embodiment of the display device DD may include a housing HS, a display module DM, a roller ROL, a module support part MSP, a support part SUP, and a handle HND. The display module DM, the roller ROL, the module support part MSP, and the support part SUP may be accommodated in the housing HS.

In the housing HS, the roller ROL may be adjacent to the other side of the housing HS, which is the opposite side of the one side of the housing HS in which the housing opening HOP is defined. When viewed in the second direction DR2, the roller ROL may have a circular shape. In an embodiment, for example, the roller ROL may have a cylindrical shape extending in the second direction DR2. The roller ROL may rotate clockwise or counter-clockwise. Although not illustrated, the display device DD may further include a driving part for rotating the roller ROL.

The display module DM may extend in the first direction DR1 and be wound around the roller ROL. One end of the display module DM may be connected to the roller ROL. The display module DM may be disposed in a way such that a portion of the display module DM is wound around the roller ROL, and another portion of the display module DM is not wound around the roller ROL and overlaps the support part SUP. The other end of the display module DM, which is opposed to the one end of the display module DM connected to the roller ROL, may be connected to the handle HND. The other end of the display module DM may be adjacent to the housing opening HOP.

The front surface of the display module DM may be defined as a surface on which images are displayed. The module support part MSP may be disposed on one surface of the display module DM. The module support part MSP may be disposed on the opposite surface of the front surface of the display module DM. In an embodiment, for example, the module support part MSP may be disposed under a lower surface of the display module DM. Hereinafter, the one surface of the display module DM may be defined as a lower surface of a display module.

The module support part MSP may be attached to the one surface of the display module DM. In an embodiment, for example, the module support part MSP may be attached to a rear surface (or the lower surface) of the display module DM through a pressure sensitive adhesive.

The module support part MSP may extend in the first direction DR1 and be wound around the roller ROL. One end of the module support part MSP may be connected to the roller ROL, and the other end of the module support part MSP may be connected to the handle HND. The other end of the module support part MSP may be adjacent to the housing opening HOP. The module support part MSP may be disposed in a way such that a portion of the module support part MSP is wound around the roller ROL, and another portion of the module support part MSP is not wound around the roller ROL and overlaps the support part SUP.

The module support part MSP may include a support layer SPL disposed under the display module DM and extending in the first direction DR1, a support SPP disposed in the support layer SPL, and a magnetic particle layer SMP disposed to be adjacent to the support SPP in the support layer SPL. The support SPP may have greater rigidity than the support layer SPL. In an embodiment, for example, as shown in FIG. 3, the support SPP may include a plurality of support bars SB arranged in the first direction DR1, and the support SPP may include a plate with openings OP defined therein. The shape of the support SPP will be described later in greater detail with reference to FIG. 13.

One end of the support layer SPL may be connected to the roller ROL, and the other end of the support layer SPL may be connected to the handle HND. The other end of the support layer SPL may be adjacent to the housing opening HOP. The support layer SPL may be disposed in a way such that a portion of the support layer SPL is wound around the roller ROL, and another portion of the support layer SPL is not wound around the roller ROL and overlaps the support part SUP.

When viewed in the second direction DR2, the support bars SB may have a quadrilateral shape. However, the shapes of the side surfaces of the support bars SB are not limited thereto, and the support bars SB may have various shapes. The shapes of the support bars SB will be described later in greater detail with reference to FIGS. 17A to 17D.

The magnetic particle layer SMP may be disposed in the support layer SPL. The magnetic particle layer SMP may be disposed on top of and/or under (above and/or below, or on an upper surface and/or a lower surface of) the support SPP. In an embodiment, for example, the magnetic particle layer SMP may be disposed on one surface of the support bars SB. The magnetic particle layer SMP may overlap the support SPP in a thickness direction of the support layer SPL in which the magnetic particle layer SMP and the support SPP are disposed. The configurations of the support bars SB and the magnetic particle layer SMP will be described later in greater detail with reference to FIGS. 10A to 10B.

The display module DM and the module support part MSP may be drawn in and out through the housing opening HOP. One end of the support part SUP may be connected to the handle HND. The support part SUP may extend, like an antenna, in the first direction DR1. The configuration of the support part SUP will be described later in greater detail.

The support part SUP may include a guide groove GG defined therein. The module support part MSP may be disposed in the guide groove GG and move along the guide groove GG in the first direction DR1. The module support part MSP may be disposed in the guide groove GG to be supported by the support part SUP, and the module support part MSP may support the display module DM. That is, the support part SUP may substantially function to support the display module DM.

Figure 4:
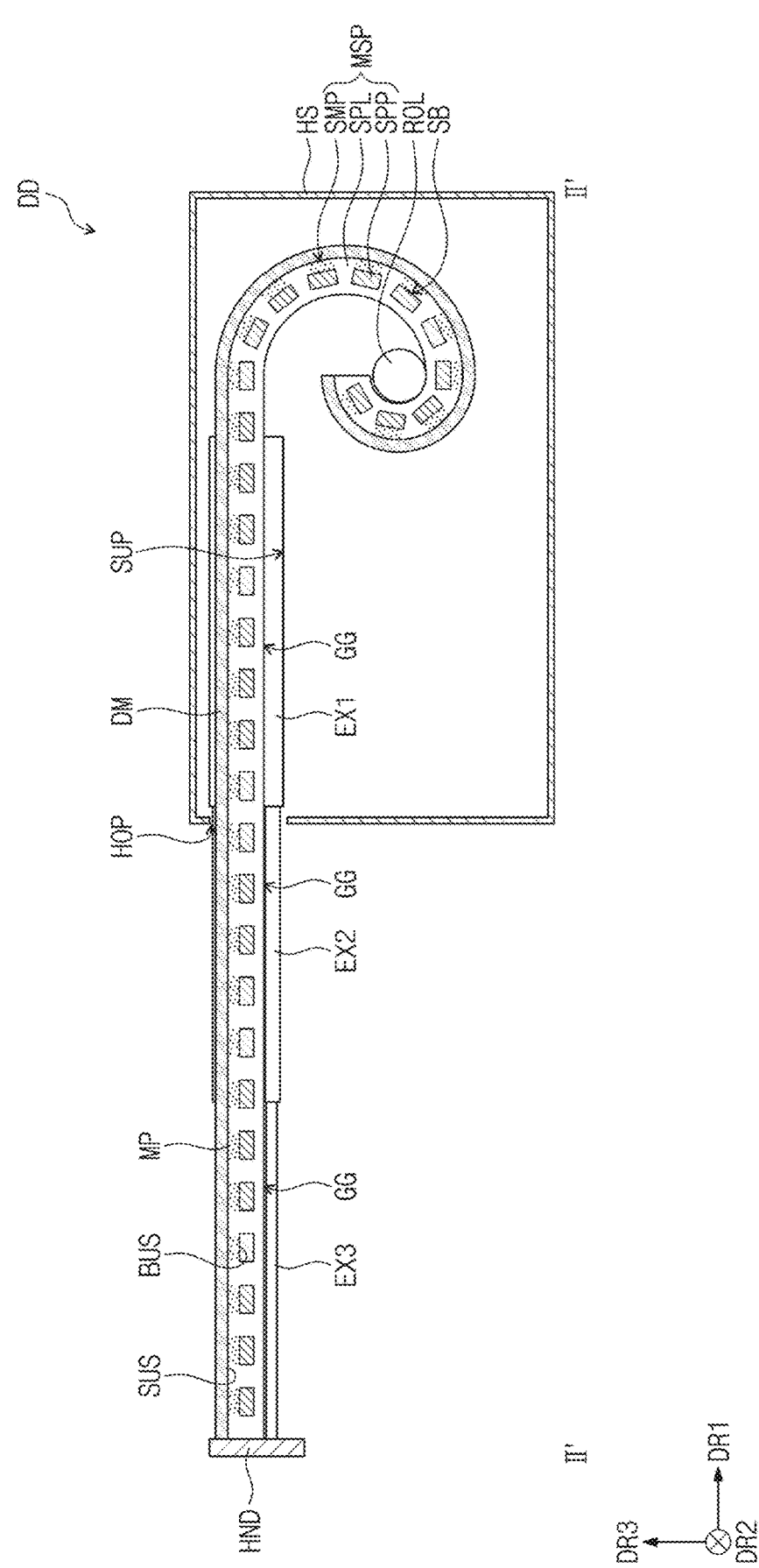
FIG. 4 is a cross-sectional view taken along line II-II' illustrated in FIG. 2.

FIG. 4 is a cross-sectional view taken along line II-II' illustrated in FIG. 2.

Referring to FIG. 4, the handle HND may move in the first direction DR1 to be away from the housing HS. As the handle HND moves, the display module DM and the module support part MSP connected to the handle HND may move in the first direction DR1. The display module DM and the module support part MSP may be unwound from the roller ROL, and the unwound display module DM and module support part MSP may be drawn out to the outside of the housing HS through the housing opening HOP. Therefore, an exposed portion of the display module DM may be expanded.

As the handle HND moves, the support part SUP connected to the handle HND may be expanded to the outside of the housing HS through the housing opening HOP when the display module DM and the module support part MSP are drawn out from the housing HS. The support part SUP may be expanded to the outside of the housing HS and support the display module DM outside the housing HS.

The module support part MSP, which has moved to the outside of the housing HS, may be supported by the support part SUP, and the module support part MSP supported by the support part SUP may support the display module DM.

The support part SUP may include a first extension EX1, a second extension EX2, and a third extension EX3 to be expanded to the outside of the housing HS. The second extension EX2 may be disposed between the first extension EX1 and the third extension EX3.

In an embodiment, the second extension EX2 may be drawn in and out from the first extension EX1, and the third extension EX3 may be drawn in and out from the second extension EX2 such that an expandable structure like an antenna may be achieved. The first extension EX1 may be disposed inside the housing HS, and the second and third extensions EX2 and EX3 may move to the outside of the housing HS. The third extension EX3 may be connected to the handle HND.

The first to third extensions EX1, EX2, and EX3 may include guide grooves GG defined therein, respectively. The guide grooves GG defined in the first to third extensions EX1, EX2, and EX3 may be defined as a continuous space overlapping each other in the first direction DR1. The module support part MSP may be disposed in the guide grooves GG.

When the handle HND moves in the first direction DR1 to be closer to the housing HS, the handle HND may be disposed, in the outside of the housing HS, to be adjacent to the housing opening HOP as illustrated in FIG. 3. As the handle HND moves, the support part SUP may shrink in the first direction DR1 to be disposed inside the housing HS, and the display module DM and the module support part MSP may be drawn in the housing HS.

Figure 5:
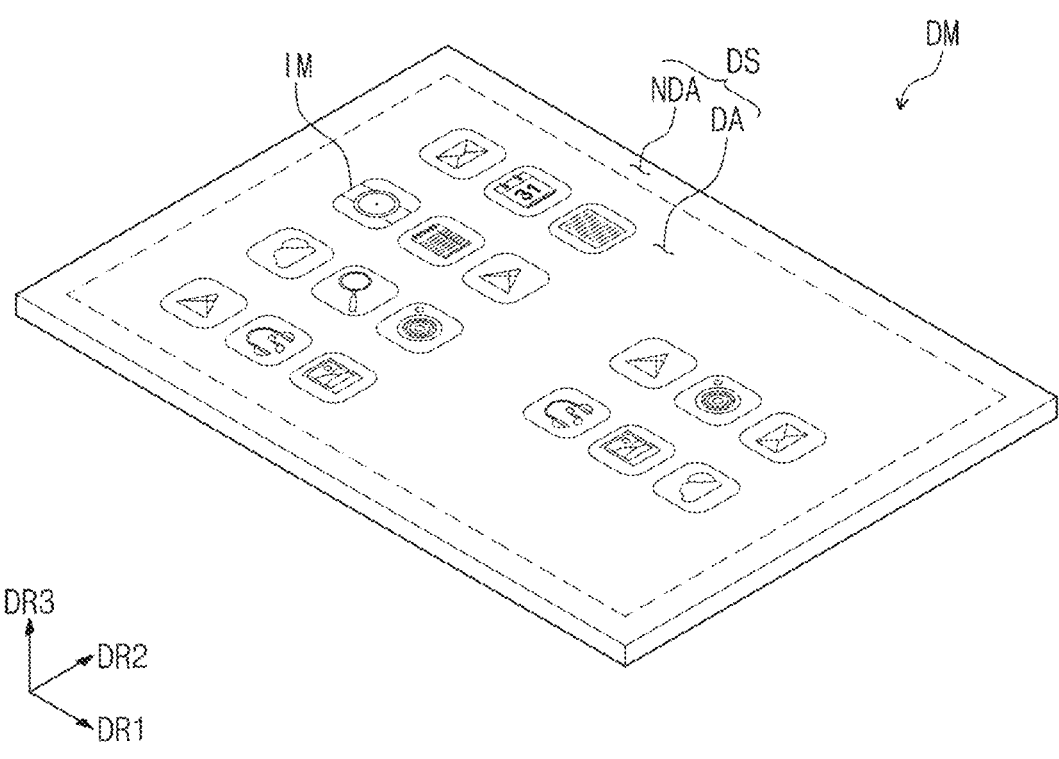
FIG. 5 is a view illustrating a display module accommodated in a housing illustrated in FIG. 1.

FIG. 5 is a view illustrating a display module accommodated in the housing illustrated in FIG. 1.

Referring to FIG. 5, an embodiment of the display module DM may have a rectangular shape which has long sides extending in the first direction DR1 and short sides extending in the second direction DR2. However, the embodiment of the invention is not limited thereto, and the display module DM may have various shapes such as a circular shape or a polygonal shape.

The upper surface of the display module DM may be defined as a display surface DS and have a plane defined by the first direction DR1 and the second direction DR2. Images IM generated by the display module DM through the display surface DS may be provided to users.

The display surface DS may include a display region DA and a non-display region NDA around the display region DA. The display region DA may display images, and the non-display region NDA may not display images. The non-display region NDA may surround the display region DA and define a border of the display module DM printed in a predetermined color.

Figure 6:
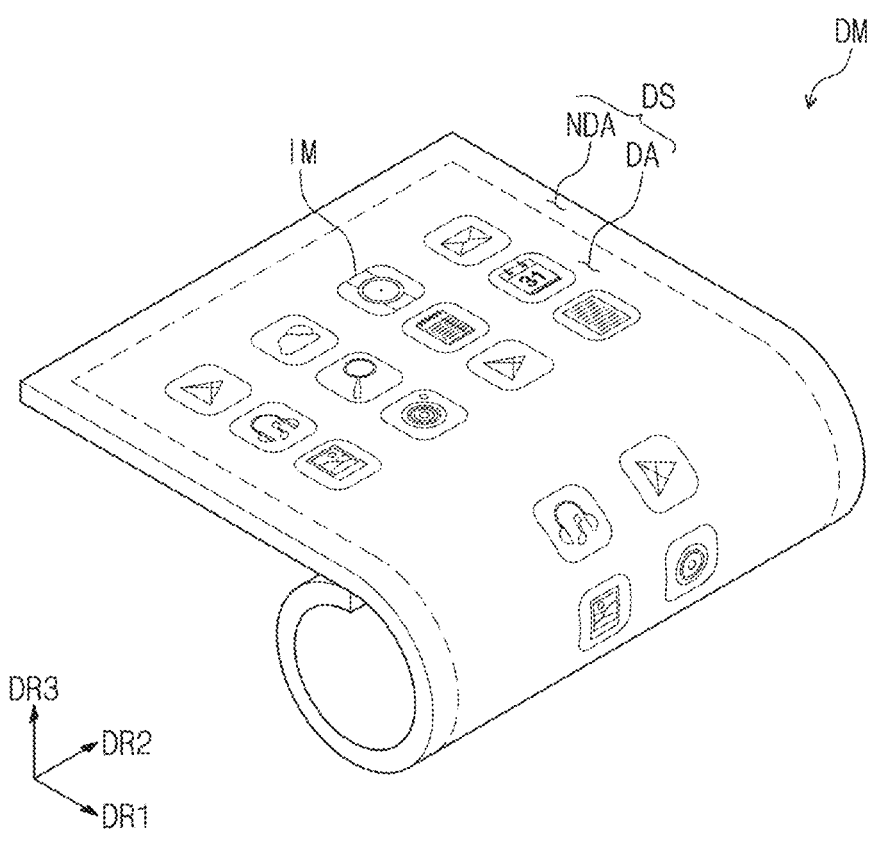
FIG. 6 is a view illustrating a display module illustrated in FIG. 5 in a wound state.

FIG. 6 is a view illustrating the display module illustrated in FIG. 5 in a wound state.

Referring to FIG. 6, the display module DM may be a flexible or rollable display module. The display module DM may be rolled like a scroll. The display module DM may be rolled in the first direction DR1. The display module DM may be rolled from one side of the display module DM. The display module DM may be rolled toward the outside of the display surface DS. However, an embodiment of the invention is not limited thereto, and the display module DM may be rolled toward the inside of the display surface DS.

Figure 7:
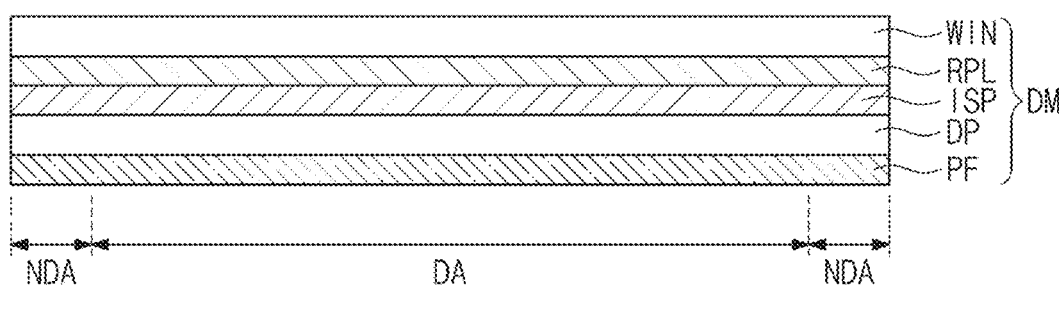
FIG. 7 is a view exemplarily illustrating a cross section of a display module illustrated in FIG. 5.
Figure 7:
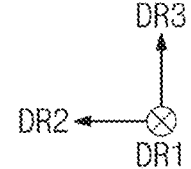

FIG. 7 is a view exemplarily illustrating a cross section of a display module illustrated in FIG. 5.

Particularly, FIG. 7 illustrates a cross section of the display module DM when viewed in the first direction DR1.

Referring to FIG. 7, an embodiment of the display module DM may include a display panel DP, an input detection portion ISP, an anti-reflection layer RPL, a window WIN, and a panel protection film PF.

The display panel DP may be a flexible display panel. The display panel DP according to an embodiment of the invention may be a light-emitting type display panel, and is not particularly limited thereto. In an embodiment, for example, the display panel DP may be an organic light emitting display panel or an inorganic light emitting display panel. A light-emitting layer of the organic light emitting display panel may include an organic light emitting material. A light-emitting layer of the inorganic light emitting display panel may include a quantum dot, a quantum rod, and the like. Hereinafter, embodiments where the display panel DP is an organic light emitting display panel will be described in detail.

The input detection portion ISP may be disposed on the display panel DP. The input detection portion ISP may include a plurality of sensor portions (not illustrated) for sensing an external input in a capacitive manner. In an embodiment, the input detection portion ISP may be directly manufactured on the display panel DP when the display device DD is manufactured. However, an embodiment of the invention is not limited thereto, and alternatively, the input detection portion ISP may be manufactured as a panel separately from the display panel DP and be attached to the display panel DP through an adhesive layer.

The anti-reflection layer RPL may be disposed on the input detection portion ISP. The anti-reflection layer RPL may be directly formed on the input detection portion ISP, or be bonded to the input detection portion ISP through an adhesive layer. The anti-reflection layer RPL may be defined as an external light reflection preventing film. The anti-reflection layer RPL may reduce the reflectance of external light incident from above the display device DD toward the display panel DP.

When external light emitted toward the display panel DP is reflected from the display panel DP and is provided again to an external user, the external light may be viewed by the user as if reflected from a mirror. In an embodiment, for example, the anti-reflection layer RPL may include a plurality of color filters which display the same colors as pixels of the display panel DP to reduce such reflection of the external light.

The color filters may filter external light with the same colors as pixels. In this case, the external light may not be viewed by a user. However, an embodiment of the invention is not limited thereto, and alternatively, the anti-reflection layer RPL may include a polarizing film for reducing the reflectance of external light. The polarizing film may include a retarder and/or a polarizer.

The window WIN may be disposed on the anti-reflection layer RPL. In an embodiment, the window WIN may be directly formed on the anti-reflection layer RPL or bonded to the anti-reflection layer RPL through an adhesive layer. The window WIN may protect the display panel DP, the input detection portion ISP, and the anti-reflection layer RPL against external scratches and impacts.

The panel protection film PF may be disposed below the display panel DP. The panel protection film PF may be directly formed below the display panel DP or bonded to the display panel DP through an adhesive layer. The panel protection film PF may protect a lower part of the display panel DP. The panel protection film PF may include a flexible plastic material such as polyethyleneterephthalate (PET).

Figure 8:
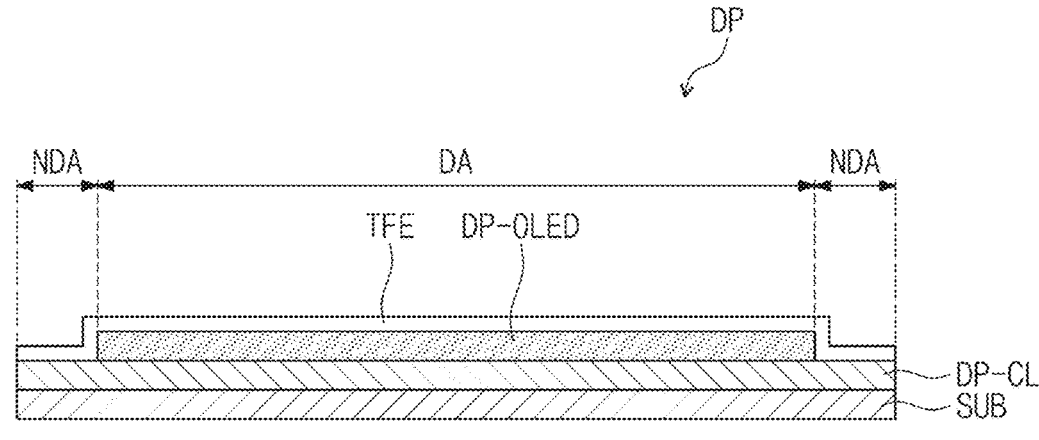
FIG. 8 is a view exemplarily illustrating a cross section of a display panel illustrated in FIG. 7.
Figure 8:
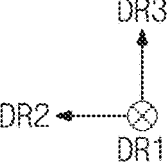

FIG. 8 is a view exemplarily illustrating a cross section of the display panel illustrated in FIG. 7.

Particularly, FIG. 8 illustrates a cross section of the display panel DP when viewed in the first direction DR1.

Referring to FIG. 8, an embodiment of the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display region DA and a non-display region NDA around the display region DA. The substrate SUB may include a flexible plastic material such as polyimide (PI). The display element layer DP-OLED may be disposed on the display region DA.

A plurality of pixels may be disposed on the substrate SUB in the display region DA. The pixels may each be connected to a transistor disposed in the circuit element layer DP-CL and each include a light-emitting element disposed in the display element layer DP-OLED.

The thin-film encapsulation layer TFE may be disposed on the circuit element layer DP-CL to cover the display element layer DP-OLED. The thin-film encapsulation layer TFE may include inorganic layers and an organic layer between the inorganic layers. The inorganic layers may protect the pixels against oxygen/moisture. The organic layer may protect the pixels PX against foreign substances such as dust particles.

Figure 9:
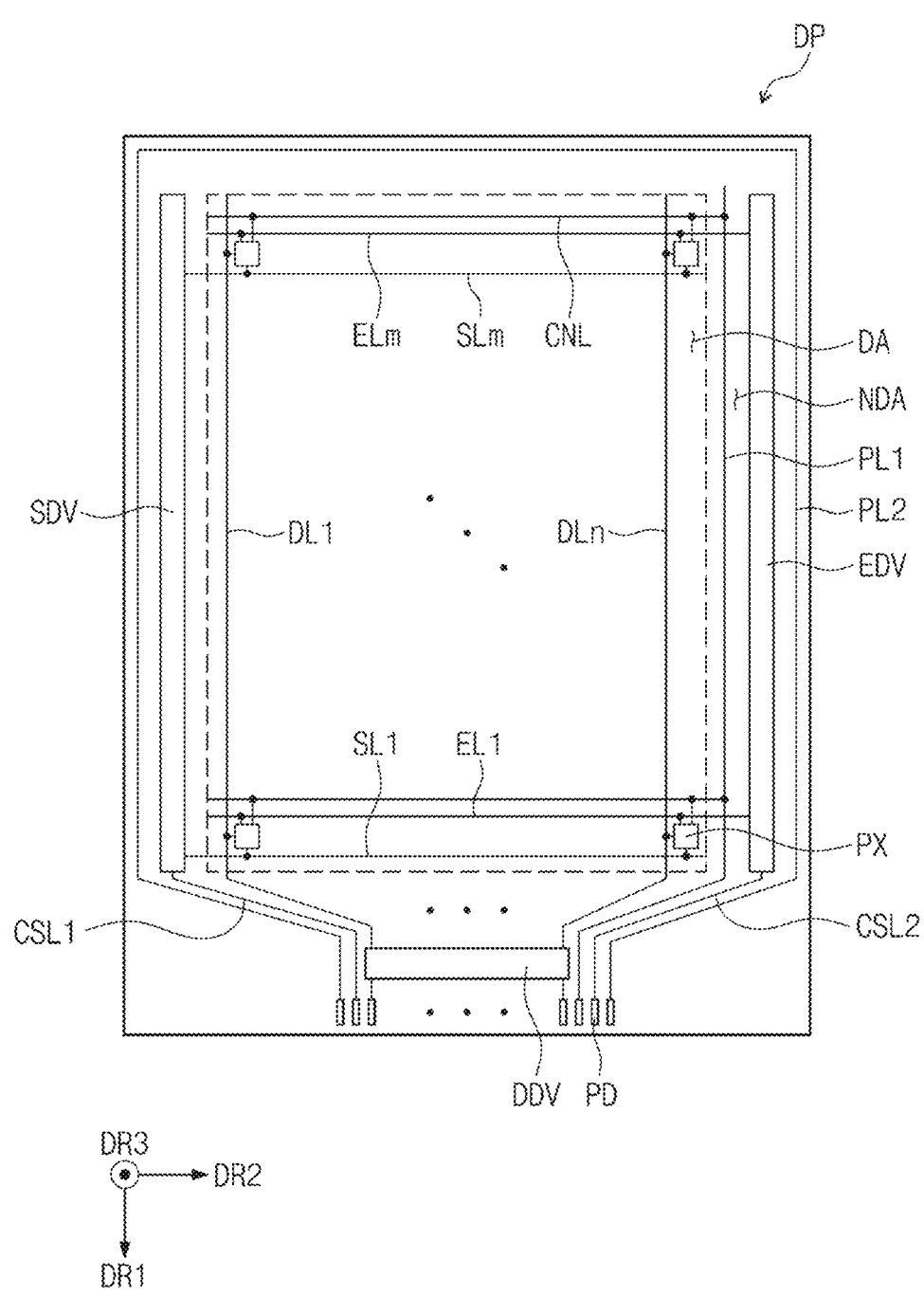
FIG. 9 is a plan view of a display panel illustrated in FIG. 8.

FIG. 9 is a plan view of the display panel illustrated in FIG. 8.

Referring to FIG. 9, an embodiment of the display device DD may include a display panel DP, a scan driver SDV, a data driver DDV, an emission driver EDV, and a plurality of pads PD. The display panel DP may include a display region DA and a non-display region NDA surrounding the display region DA.

The display panel DP may include a plurality of pixels PX, a plurality of scan lines SL1 to SLm, a plurality of data lines DL1 to DLn, a plurality of light-emitting lines EL1 to Elm, first and second control lines CSL1 and CSL2, first and second power lines PL1 and PL2, and connection lines CNL. Here, m and n are natural numbers.

The pixels PX may be each disposed in the display region DA. The scan driver SDV and the emission driver EDV may be each disposed in the non-display region NDA adjacent to the long sides of the display panel DP. The data driver DDV may be disposed in the non-display region NDA adjacent to one of the short sides of the display panel DP. When viewed on a plane (i.e., when viewed in a plan view in the third direction DR3, the data driver DDV may be adjacent to a lower end (or side) of the display panel DP.

The scan lines SL1 to SLm may extend in the second direction DR2 to be connected to the pixels PX and the scan driver SDV. The data lines DL1 to DLn may extend in the first direction DR1 to be connected to the pixels PX and the data driver DDV. The light-emitting lines EL1 to Elm may extend in the second direction DR2 to be connected to the pixels PX and the emission driver EDV.

The first power line PL1 may extend in the first direction DR1 and be disposed in the non-display region NDA. The first power line PL1 may be disposed between the display region DA and the emission driver EDV, but is not limited thereto, and may be disposed between the display region DA and the scan driver SDV.

The connection lines CNL may extend in the second direction DR2 and be arranged in the first direction DR1. The connection lines CNL may be connected to the first power line PL1 and the pixels PX. A first voltage may be applied to the pixels PX via the first power line PL1 and the connection lines CNL connected to each other.

The second power line PL2 may be disposed in the non-display region NDA. The second power line PL2 may extend along long sides of the display panel DP and another short side, of the display panel DP, in which the data driver DDV is not disposed. The second power line PL2 may be disposed further outside (or closer to an adjacent side of the display panel DP) than the scan driver SDV and the emission driver EDV.

Although not illustrated, the second power line PL2 may extend toward the display region DA to be connected to the pixels PX. A second voltage having a lower level than the first voltage may be applied to the pixels PX via the second power line PL2.

The first control line CSL1 may be connected to the scan driver SDV, and when viewed on a plane, may extend toward a lower end of the display panel DP. The second control line CSL2 may be connected to the emission driver EDV, and when viewed on a plane, may extend toward a lower end of the display panel DP. The data driver DDV may be disposed between the first control line CSL1 and the second control line CSL2.

The pads PD may be disposed on the display panel DP. The pads PD may be more adjacent to a lower end of the display panel DP than the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not illustrated, the display device DD may further include a timing controller for controlling the operations of the scan driver SDV, the data driver DDV, and the emission driver EDV and a voltage generator for generating the first and the second voltages. The timing controller and the voltage generator may be connected to the corresponding pads PD through a printed circuit board.

The scan driver SDV may generate a plurality of scan signals, and the scan signals may be applied to the pixels PX via the scan lines SL1 to SLm. The data driver DDV may generate a plurality of data voltages, and the data voltages may be applied to the pixels PX via the data lines DL1 to DLn. The emission driver EDV may generate a plurality of light-emitting signals, and the light-emitting signals may be applied to the pixels PX via the light-emitting lines EL1 to Elm.

The pixels PX may receive data voltages in response to the scan signals. The pixels PX may display an image by emitting light having a luminance corresponding to the data voltages in response to the light-emitting signals. Light-emitting time of the pixels PX may be controlled through light-emitting signals.

The display panel DP may be rollable or rolled in the first direction DR1. The display panel DP may be rolled from one side of the display panel DP adjacent to the data driver DDV. However, an embodiment of the invention is not limited thereto, and the display panel DP may be rolled from the other side, of the display panel DP, opposed to the one side of the display panel DP.

Figure 10A:
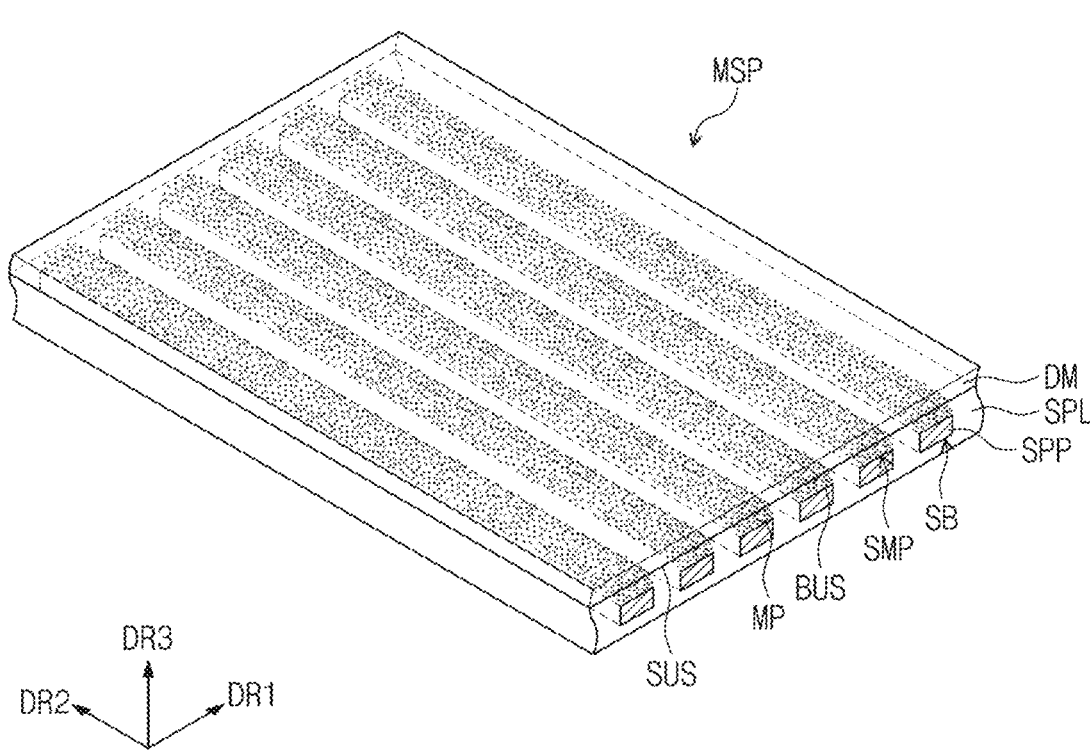
Figure 10B:
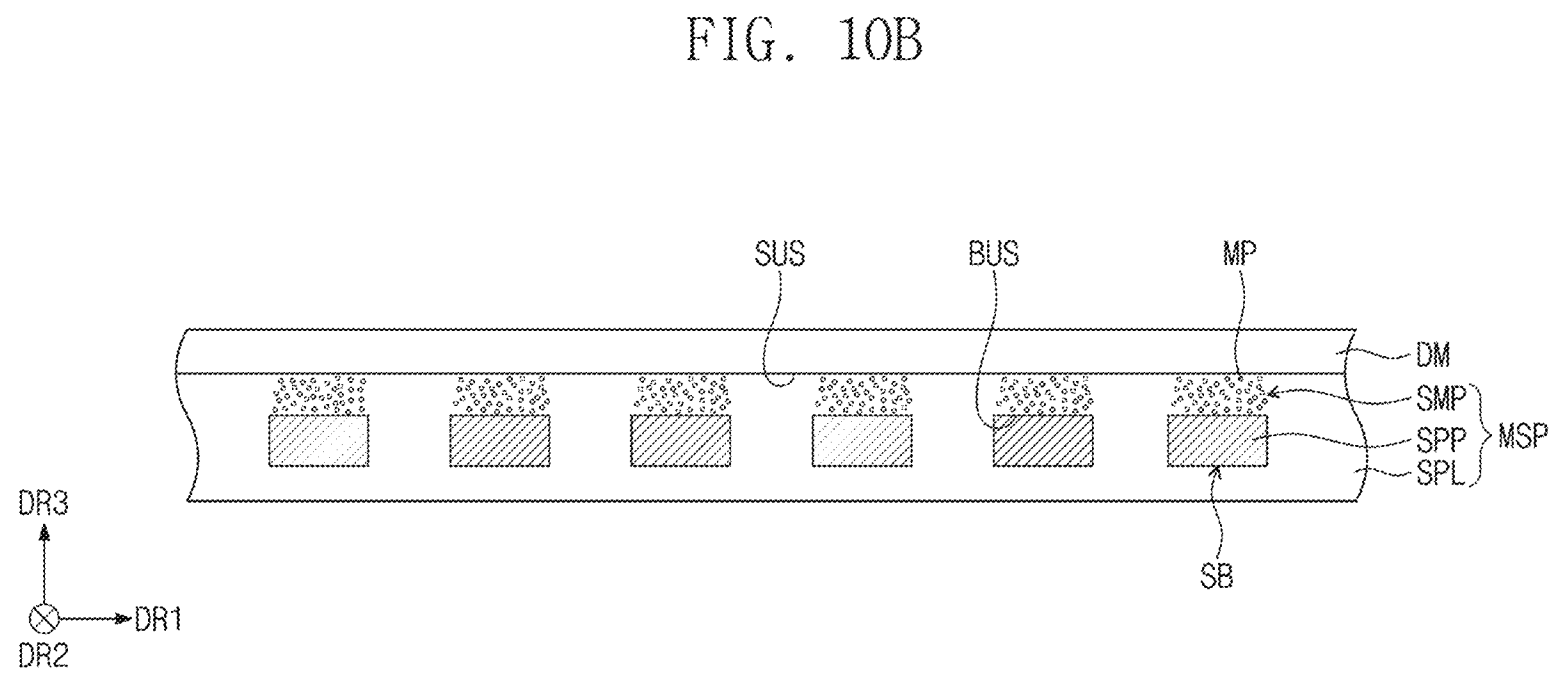

FIGS. 10A and 10B are views illustrating a portion of the module support part and the display module illustrated in FIGS. 3 and 4.

Particularly, FIG. TOA is a perspective view illustrating the module support part MSP in a flat state, and FIG. 10B is a view illustrating the module support part MSP when viewed in the second direction DR2.

FIGS. 10A and 10B illustrate an embodiment where a support SPP includes or is defined by a plurality of support bars SB.

Referring to FIGS. 10A and 10B, the module support part MSP may be disposed on one surface of the display module DM. In an embodiment, for example, the module support part MSP may be disposed under or on a lower surface of the display module DM. The module support part MSP may include a support SPP, a support layer SPL, and a magnetic particle layer SMP.

In an embodiment, for example, the support SPP may include the support bars SB. The support bars SB may be arranged in the first direction DR1 and extend in the second direction DR2. In FIG. 10A, the support bars SB arranged in the support layer SPL are illustrated as a dotted line. The support bars SB may be spaced apart from each other in the first direction DR1. The interval between two support bars SB adjacent to each other may be in a range of about 100 micrometers to about 200 micrometers. The support bars SB may be spaced apart from each other at regular intervals in the first direction DR1, but the interval between the support bars SB is not limited thereto.

The support bars SB may be a rigid type. In an embodiment, for example, the support bars SB may include a metal. The support bars SB may include aluminum, stainless steel, or invar. In such an embodiment, the support bars SB may include a metal attracted by a magnet. However, the support bars SB are not limited thereto and may include carbon fiber reinforced plastics (CFRP).

One surface BUS, among surfaces each of the support bars SB, opposed to each other in the third direction DR3, may face the display module DM. Opposing ends, each of the support bars SB, opposed to each other in the second direction DR2 may not be disposed in the support layer SPL and be exposed to the outside. The opposing ends of each of the support bars SB may be exposed to the outside according to a method of manufacturing the module support part MSP, and the manufacturing method will be described later in detail with reference to FIGS. 16A to 16G.

In an embodiment, as illustrated in FIG. 10A, when the module support part MSP is viewed in the second direction DR2, the support bars SB may have a quadrilateral shape. However, the shapes of the side surfaces of the support bars SB are not limited thereto, and the support bars SB may have various shapes. Shapes of various embodiments of the support bars SB will be described later with reference to FIGS. 18A to 18D.

The support layer SPL may include an elastic polymer having a predetermined elastic force. In an embodiment, for example, the support layer SPL may include an elastic polymer such as polyurethane or silicone.

The support bars SB may be greater in rigidity than the support layer SPL. The support bars SB may be greater in elastic modulus than the support layer SPL. In an embodiment, the support layer SPL may have an elastic modulus in a range of about 20 kilopascals (KPa) to about 20 megapascals (MPa). In such an embodiment, the support bars SB may have an elastic modulus in a range of about 1 giga pascal (GPa) to about 200 giga pascals (GPa).

The magnetic particle layer SMP may be disposed in the support layer SPL. The magnetic particle layer SMP may be disposed to be adjacent to one surface SUS of the support layer SPL in the support layer SPL. The magnetic particle layer SMP may be disposed on one surface BUS of each of the support bars SB facing the display module DM. The magnetic particle layer SMP may be disposed to be adjacent to the support bars SB. In an embodiment, for example, the magnetic particle layer may be disposed on top of the support bars SB.

The magnetic particle layer SMP may be disposed to be adjacent to one surface of the support layer SPL facing the display module DM. The magnetic particle layer SMP may be adjacent to the one surface of the support layer SPL and include a plurality of magnetic particle patterns. The magnetic particle patterns of the magnetic particle layer SMP may be arranged along the support bars SB in the first direction DR1 and extend in the second direction DR2.

The magnetic particle layer SMP may include a plurality of particles MP each having magnetic properties. In an embodiment, for example, the particles MP of the magnetic particle layer SMP may include iron, cobalt, nickel, iron oxide, chromium oxide, or ferrite. The particles MP of the magnetic particle layer SMP may each have a size in a range of about 500 nanometers to about 10 micrometers. The size of each particle MP may be defined as a diameter (or a maximum width) of each particle MP.

The particles MP of the magnetic particle layer SMP may be greater in elastic modulus than the support layer SPL. In an embodiment, for example, the particles MP may have an elastic modulus of about 60 megapascals (MPa).

The magnetic particle layer SMP may be disposed on one surface of each of the support bars SB facing the display module DM. In an embodiment, for example, when viewed on a plane, the density of the particles MP disposed in a portion of the magnetic particle layer SMP between two support bars SB adjacent to each other may be less than the density of the particles MP disposed in a portion of the magnetic particle layer SMP on one surface of each of the support bars SB. However, the density of the particles MP may not be limited thereto. The density of the particles MP will be described later in greater with reference to FIGS. 11A to 11C.

In an embodiment, the support layer SPL may be formed by curing a resin. The module support part MSP may have a configuration in which the rigid support bars SB are immersed in the support layer SPL. When an impact is applied to the display module DM, the impact may be transmitted to the module support part MSP, which leads to the deformation of the support layer SPL. When the support layer SPL is deformed, a flexure may be formed in the support layer SPL, and the display module DM, disposed on the support layer SPL having the flexure formed thereon, may also have a flexure thereon. This may cause a defect such as deterioration of the surface quality of the display module DM.

In addition, when the display module DM is wound around and unwound from the roller ROL, static electricity may be generated on a surface of the display module DM due to friction or the like. The static electricity may cause the display module DM to be damaged.

In an embodiment, as illustrated in FIGS. 10A and 10B, the magnetic particle layer SMP having a greater elastic modulus than the support layer SPL is disposed in a region adjacent to one surface SUS of the support layer SPL facing the display module DM (or a region in the support layer SPL between the support bars SB and the display module), and thus the impact resistance of the module support part MSP may be enhanced.

TABLE 1

| | Where particles are disposed on one surface of each of support bars | Where particles are disposed on one surface of each of support bars and between support bars adjacent to each other | Where particles are neither disposed on one surface of each of support bars nor between support bars adjacent to each other |
|---|---|---|---|
| Drop height of a pen | 9 cm | 9 cm | 7 cm |

Table 1 shows an experimental example for confirming impact resistance. A test for confirming impact resistance may be performed through a pen drop experiment. The pen drop experiment may be performed by dropping a pen from different heights onto the display module DM and the module support part MSP in FIG. 7. The heights shown in Table 1 may be heights that may cause the display module DM and the module support part MSP to be damaged when the pen is dropped from the heights. Referring to Table 1, it may be seen that when the magnetic particle layer SMP including the particles MP is disposed on the one surface BUS of each of the support bars SB, the drop height of a pen is increased. It may be seen that when the magnetic particle layer SMP is disposed on the one surface BUS of each of the support bars SB and between the support bars adjacent to each other, the drop height of a pen is increased.

Accordingly, in an embodiment, even when an impact is applied to the display module DM, the magnetic particle layer SMP may enhance the impact resistance of the module support part MSP, thereby effectively preventing the deformation of the support layer SPL. Therefore, the surface quality of the display module DM may be improved.

In such an embodiment, since the magnetic particle layer SMP includes the particles MP having magnetic properties, static electricity generated on a surface of the display module DM during winding and unwinding of the display module DM may be discharged due to the particles MP. In such an embodiment, the particles MP may serve as a ground such that the display module DM may be effectively prevented from being damaged due to the static electricity.

Figures 11A, 11B:
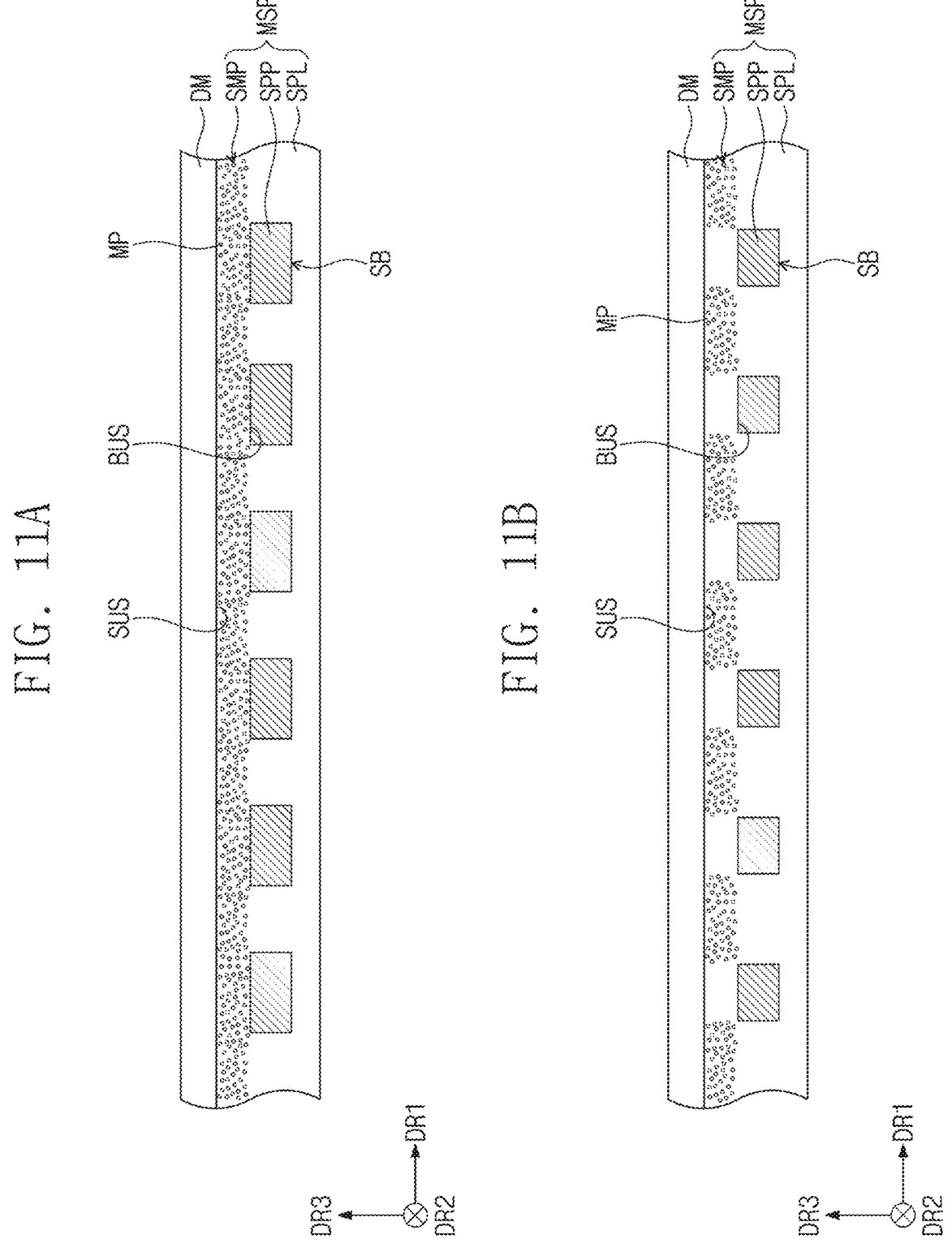
FIGS. 11A to 11C are views illustrating configurations of module support parts according to an alternative embodiment.
Figure 11C:
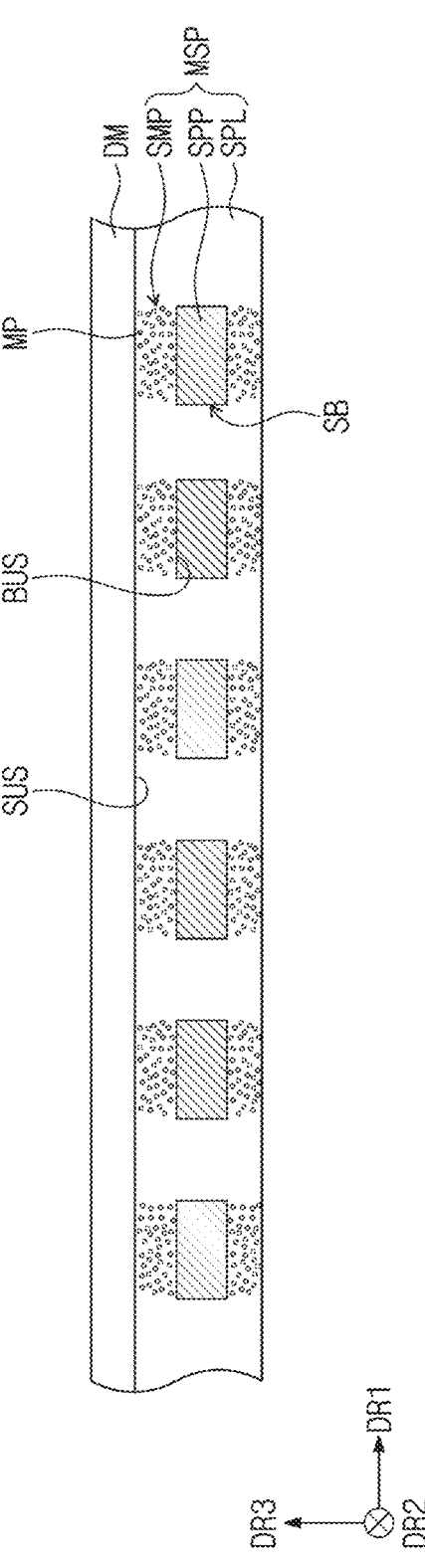

FIGS. 11A to 11C are views illustrating a density of particles according to an alternative embodiment of the invention.

Particularly, FIGS. 11A to 11C are views illustrating portions of a module support part MSP when viewed in the second direction DR2.

Support bars SB, a support layer SPL, and a display module DM illustrated in FIGS. 11A to 11C are the same as the support bars SB, the support layer SPL, and the display module DM illustrated in FIGS. 10A and 10B, and thus, any description thereof will be omitted or simplified.

Referring to FIG. 11A, in an embodiment, the density of particles MP disposed in a portion of the magnetic particle layer SMP between the support bars SB adjacent to each other may be the same as the density of the particles MP disposed in a portion of the magnetic particle layer SMP on one surface BUS of each of the support bars SB.

Referring to FIG. 11B, in an alternative embodiment, the density of the particles MP disposed in a portion of the magnetic particle layer SMP between the support bars SB adjacent to each other may be greater than the density of the particles MP disposed in a portion of the magnetic particle layer SMP on the one surface BUS of each of the support bars SB. In an embodiment, for example, the interval between two support bars adjacent to each other, among the support bars, may be in a range of about 500 micrometers to about 1 millimeter.

Referring to FIG. 11C, in another alternative embodiment, a magnetic particle layer SMP may be further disposed under the support bars SB. The module support part MSP may further include the magnetic particle layer SMP on the surface opposed to the one surface BUS of each of the support bars SB in the third direction DR3. The support bars SB may be arranged between the magnetic particle layer SMP.

FIGS. 12A to 12D show images of a module support part.

Particularly, FIGS. 12A to 12D are the images showing module support parts MSP and MSP' after applying an impact thereto.

Figure 12A:
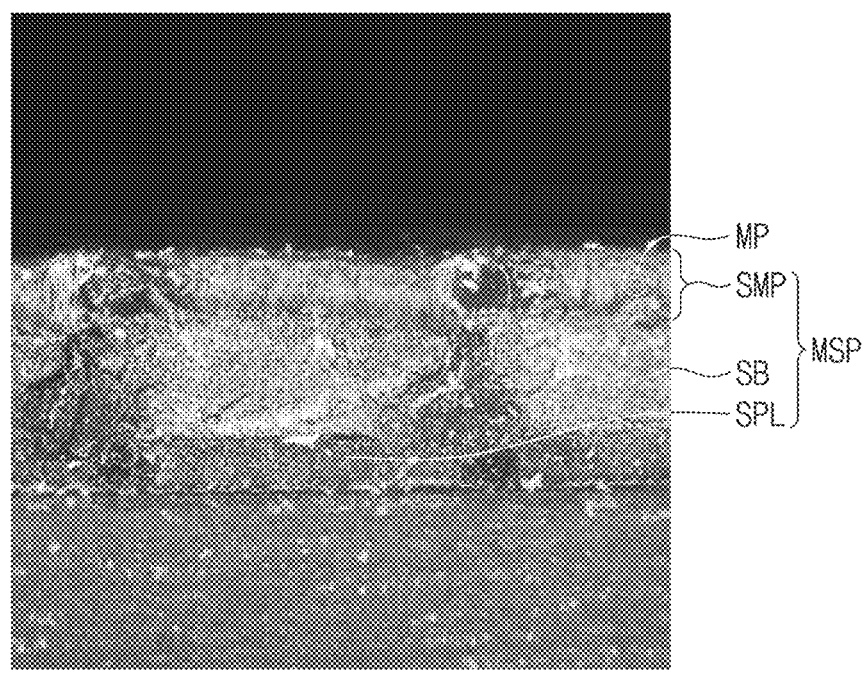
FIGS. 12A to 12D show images of a module support part.
Figure 12B:
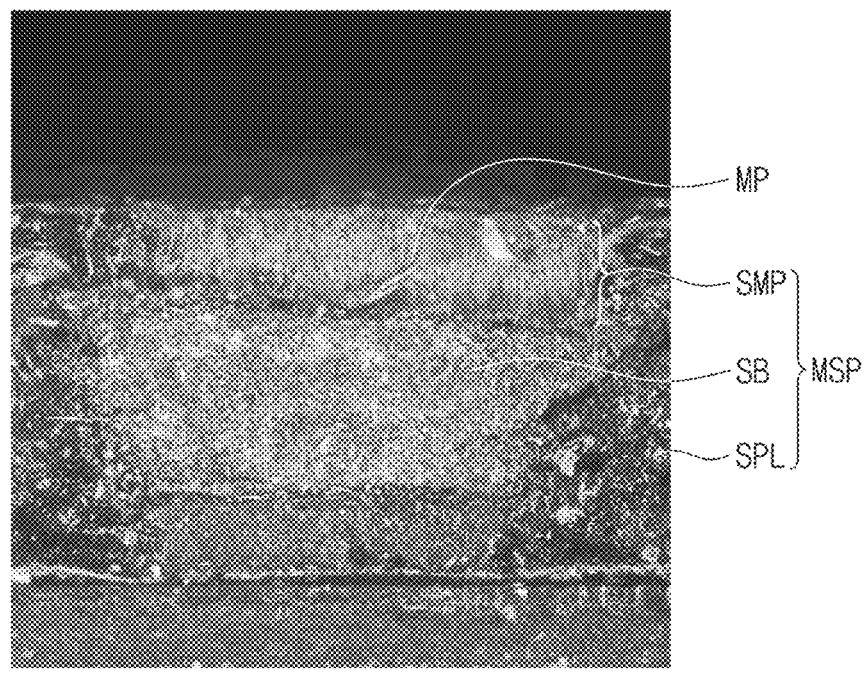
Figure 12C:
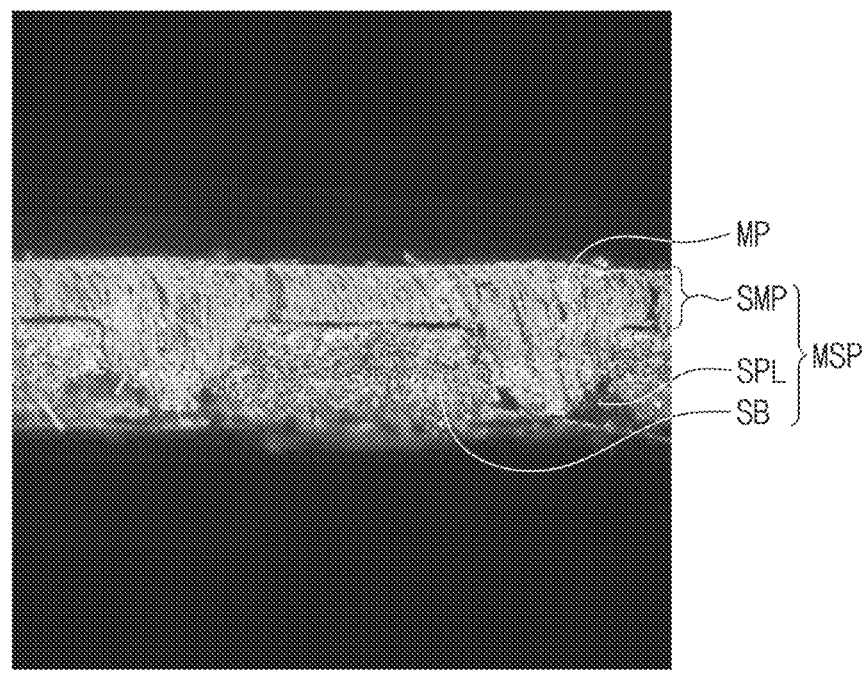
Figure 12D:
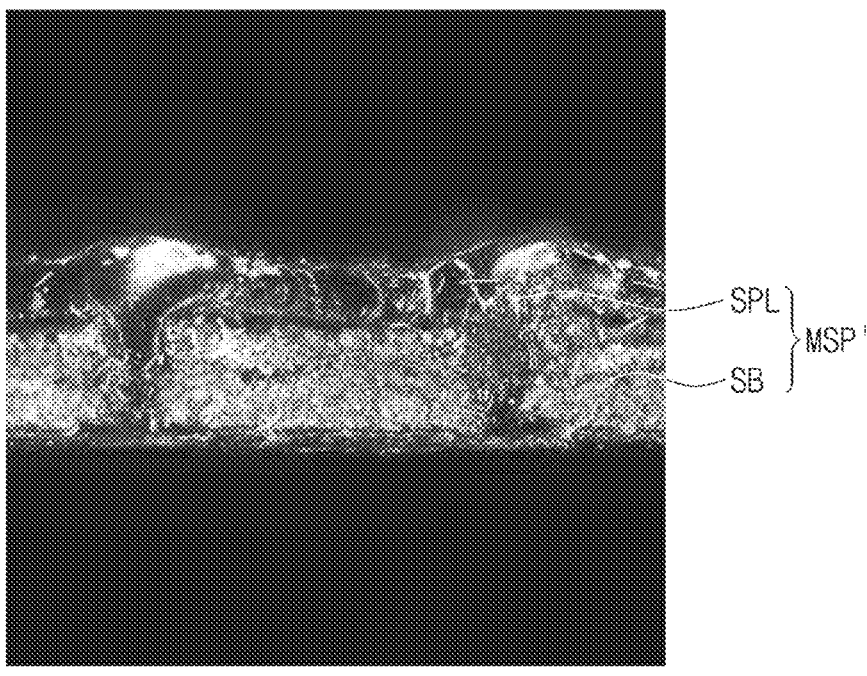

Specifically, FIGS. 12A to 12C are the images of the module support part MSP including a magnetic particle layer SMP, and FIG. 12D is the image of the module support part MSP' not including the magnetic particle layer SMP.

Referring to FIGS. 12A, 12B, and 12D, it may be confirmed that when the density of particles MP disposed in a portion of the magnetic particle layer SMP on one surface BUS of each of support bars SB is greater than the density of the particles MP in a portion of the magnetic particle layer SMP between the support bars SB adjacent to each other, the surface quality is improved even when an external impact is applied. Specifically, the upper surface of the module support part MSP, shown in FIGS. 12A and 12B, to which an external impact is applied may be flat, but the upper surface of the module support part MSP' shown in FIG. 12D may not be flat when an external impact is applied thereto.

Referring to FIGS. 12C and 12D, it may be conformed that when the density of the particles MP in a portion of the magnetic particle layer SMP disposed on the one surface BUS of each of the support bars SB is the same as the density of the particles MP disposed in a portion of the magnetic particle layer SMP between the support bars SB adjacent to each other, the surface quality is improved even when an external impact is applied. Specifically, the upper surface of the module support part MSP shown in FIG. 12C may be flat even when an external impact is applied thereto, but the upper surface of the module support part MSP' shown in FIG. 12D may not be flat when an external impact is applied thereto.

Figure 13:
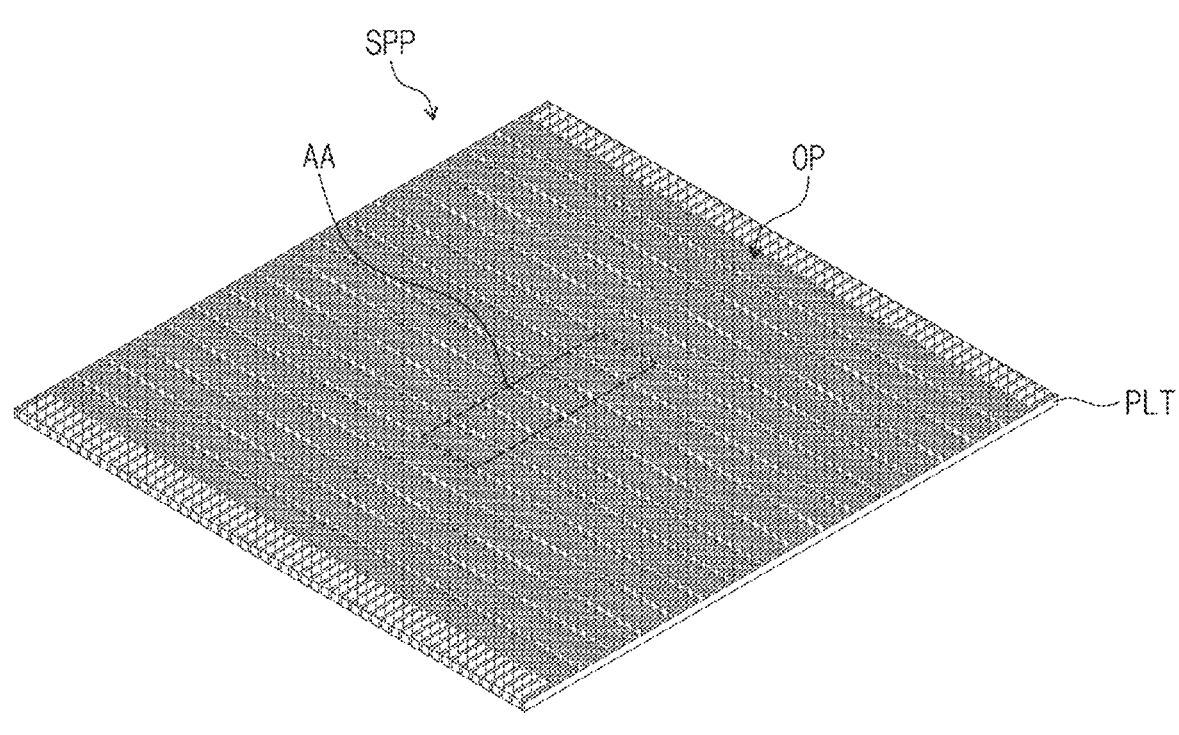
FIG. 13 is a perspective view of a support according to another alternative embodiment of the invention.
Figure 13:
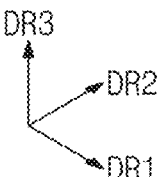
Figure 14:
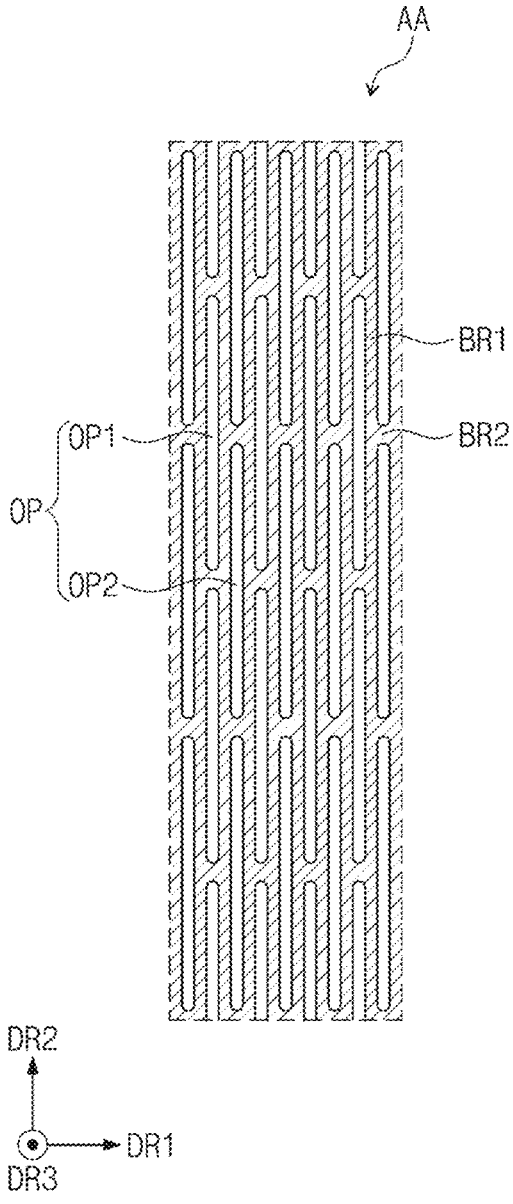
FIG. 14 is an enlarged plane view of a region AA illustrated in FIG. 13.

FIG. 13 is a perspective view of a support according to another alternative embodiment of the invention. FIG. 14 is an enlarged plane view of a region AA illustrated in FIG. 13.

Referring to FIG. 13, in an embodiment, a support SPP may include a support plate PLT. The support plate PLT may include a grid pattern defined therein. In an embodiment, for example, the support plate PLT may be provided with a plurality of openings OP defined therein. The openings OP may be arranged according to a predetermined rule. The openings OP may have a grid-like arrangement, and grid patterns may be formed in the entire region of the support plate PLT.

Since the openings OP are defined in the entire region of the support plate PLT, the area of the support plate PLT may be reduced, and thus the rigidity of the support plate PLT may be lowered. Accordingly, the support plate PLT may be more flexible in such an embodiment where the openings OP are defined in the support plate PLT than in an embodiment where the openings OP are not defined therein. Therefore, in such an embodiment, the support plate PLT may be more easily rollable.

Referring to FIGS. 13 and 14, the openings OP may be arranged in the first direction DR1 and the second direction DR2. The openings OP may extend further in the second direction DR2 than in the first direction DR1.

The openings OP may include a plurality of first openings OPT arranged in the second direction DR2 and a plurality of second openings OP2 which are adjacent to the first openings OP1 in the first direction DR1 and are arranged in the second direction DR2. The first openings OP1 and the second openings OP2 may be arranged in a staggered manner.

The support plate PLT may include first branch portions BR1 disposed between the openings OP adjacent to each other in the first direction DR1, and second branch portions BR2 disposed between the openings OP adjacent to each other in the second direction DR2. The first branch portions BR1 may extend in the second direction DR2, and the second branch portions BR2 may extend in the first direction DR1. The openings OP may be defined by the first and the second branch portions BR1 and BR2.

Figure 15A:
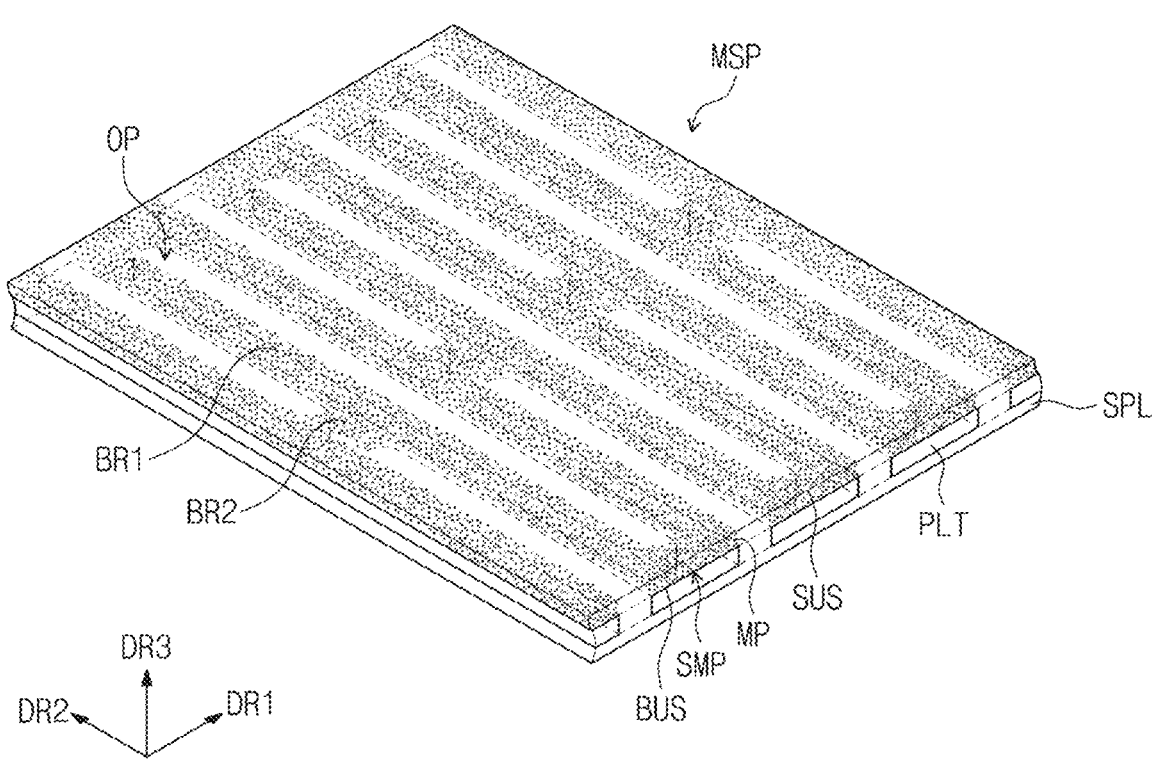
FIGS. 15A to 15C are views of embodiments of a module support part including a support plate illustrated in FIG. 13.
Figure 15B:
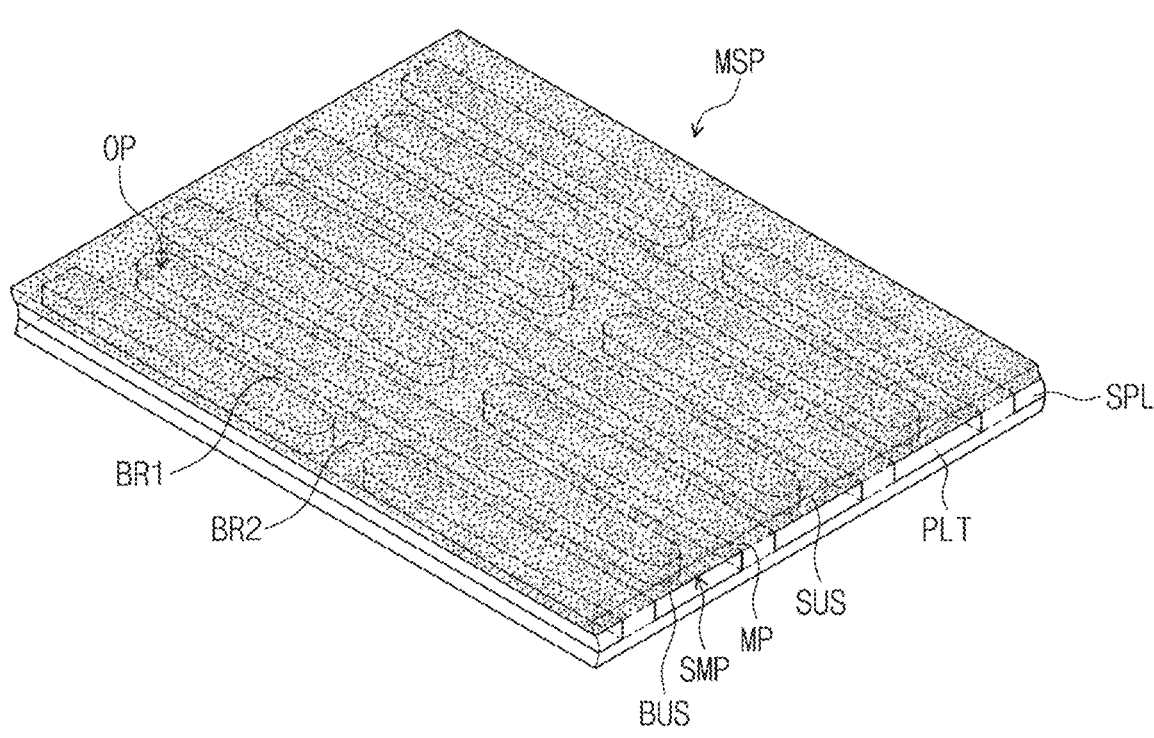
Figure 15C:
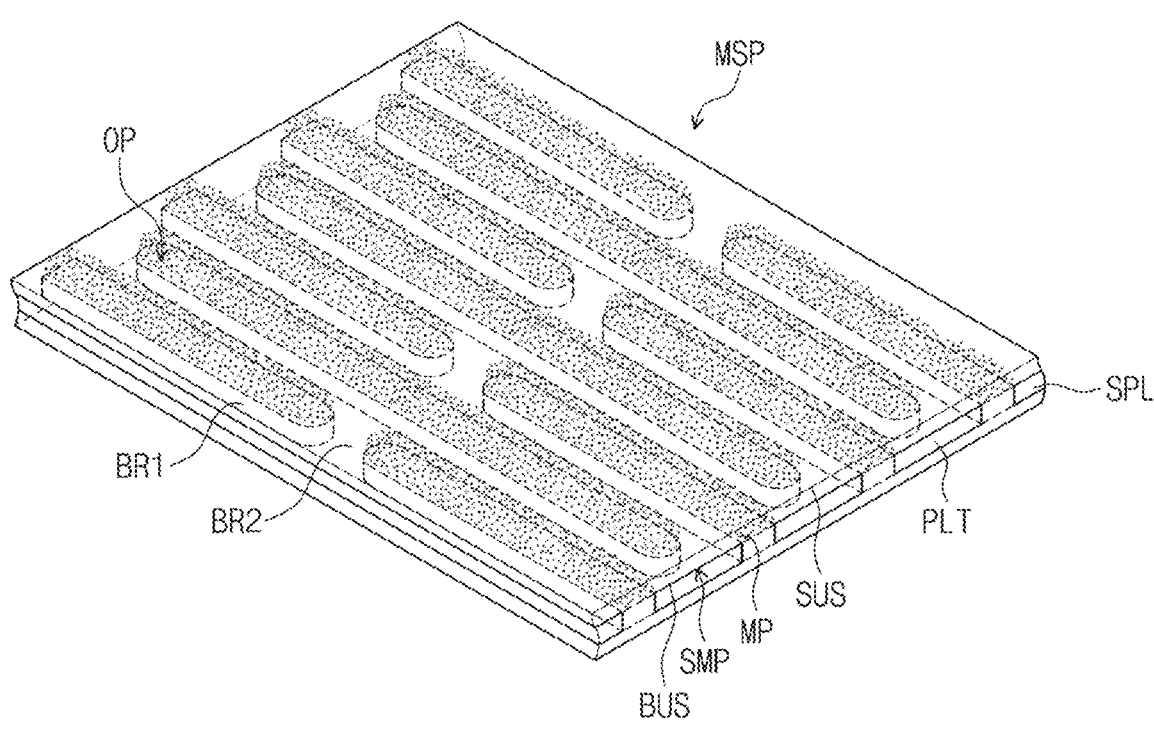

FIGS. 15A to 15C illustrate a module support part according to embodiments of the invention.

Particularly, FIGS. 15A to 15C are perspective views of various embodiments of a module support part MSP including the support plate PLT illustrated in FIG. 13.

A support layer SPL and particles MP of FIGS. 15A to 15C are the same as the support layer SPL and the particles MP of FIGS. 10A and 10B, and thus, any repetitive detailed description thereof will be omitted or will be abbreviated.

Referring to FIG. 15A, in an embodiment, a magnetic particle layer SMP may be disposed on one surface BUS of the support plate PLT facing the display module DM. The magnetic particle layer SMP may be disposed on top (or an upper surface) of the support plate PLT. The density of the particles MP disposed in a portion of the magnetic particle layer SMP on first branch portions BR1 and second branch portions BR2 may be greater than the density of the particles MP disposed in a portion of the magnetic particle layer SMP on openings OP.

Referring to FIG. 15B, in an alternative embodiment, the magnetic particle layer SMP may be disposed on the one surface BUS of the support plate PLT facing the display module DM. The magnetic particle layer SMP may be disposed on top of the support plate PLT. The density of the particles MP disposed in a portion of the magnetic particle layer SMP on the first branch portions BR1 and the second branch portions BR2 may be the same as the density of the particles MP disposed in a portion of the magnetic particle layer SMP on the openings OP.

Referring to FIG. 15C, in another alternative embodiment, the magnetic particle layer SMP may be disposed on the one surface BUS of the support plate PLT facing the display module DM. The magnetic particle layer SMP may be disposed on top of the support plate PLT. The density of the particles MP disposed in a portion of the magnetic particle layer SMP on the first branch portions BR1 and the second branch portions BR2 may be less than the density of the particles MP disposed in a portion of the magnetic particle layer SMP on the openings OP.

Although not illustrated, the magnetic particle layer SMP may be further disposed on the other surface opposed, in the third direction DR3, to the one surface BUS of the support plate PLT illustrated in FIGS. 15A to 15C.

The magnetic particle layer SMP having a greater elastic modulus than the support layer SPL is disposed on the one surface BUS of the support plate PLT facing the display module DM, such that the impact resistance of the module support part MSP may be enhanced.

In such an embodiment, even when an impact is applied to the display module DM, the impact resistance of the module support part MSP may be enhanced due to the magnetic particle layer SMP, thereby effectively preventing the deformation of the support layer SPL. Therefore, the surface quality of the display module DM may be improved.

In such an embodiment, since the magnetic particle layer SMP includes the particles MP having magnetic properties, when the display module DM is wound and unwound, static electricity generated on a surface of the display module DM may be discharged due to the particles MP. The particles MP may serve as a ground. Therefore, the display module DM may be effectively prevented from being damaged due to the static electricity.

FIGS. 16A to 16G are views illustrating a method of manufacturing a module support part according to an embodiment of the invention.

Figure 16A:
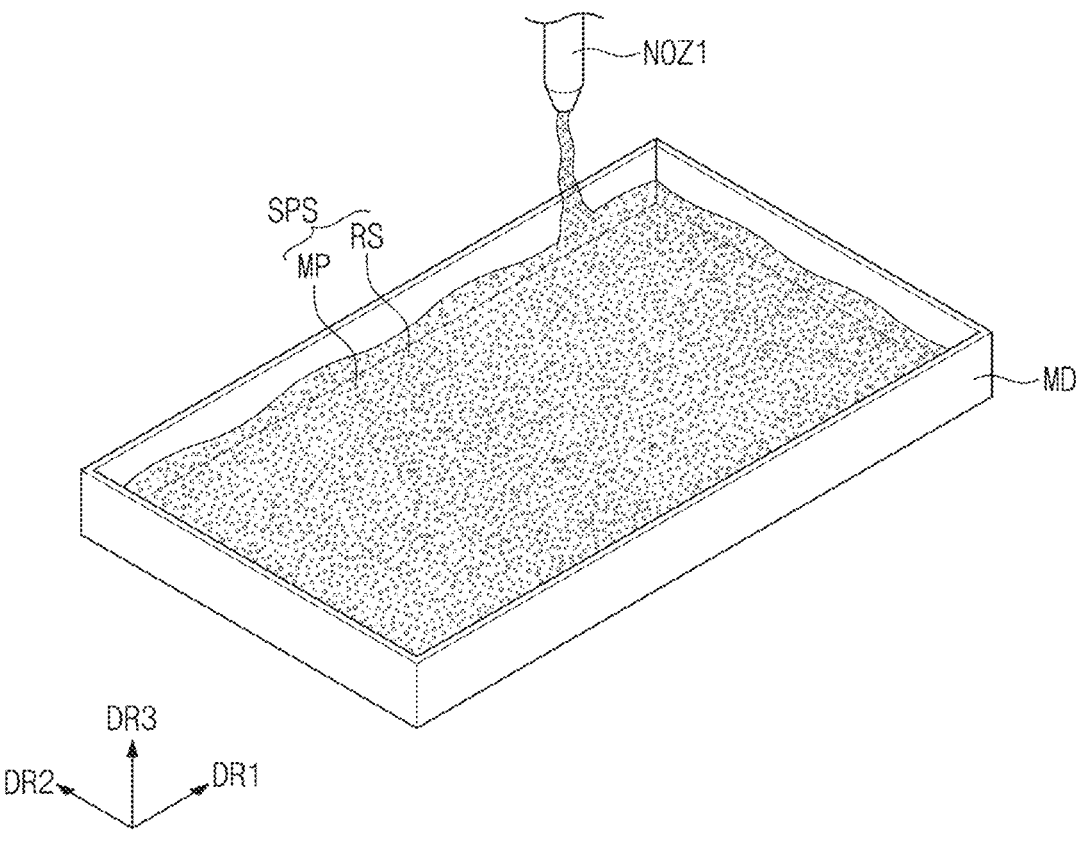
Figure 16B:
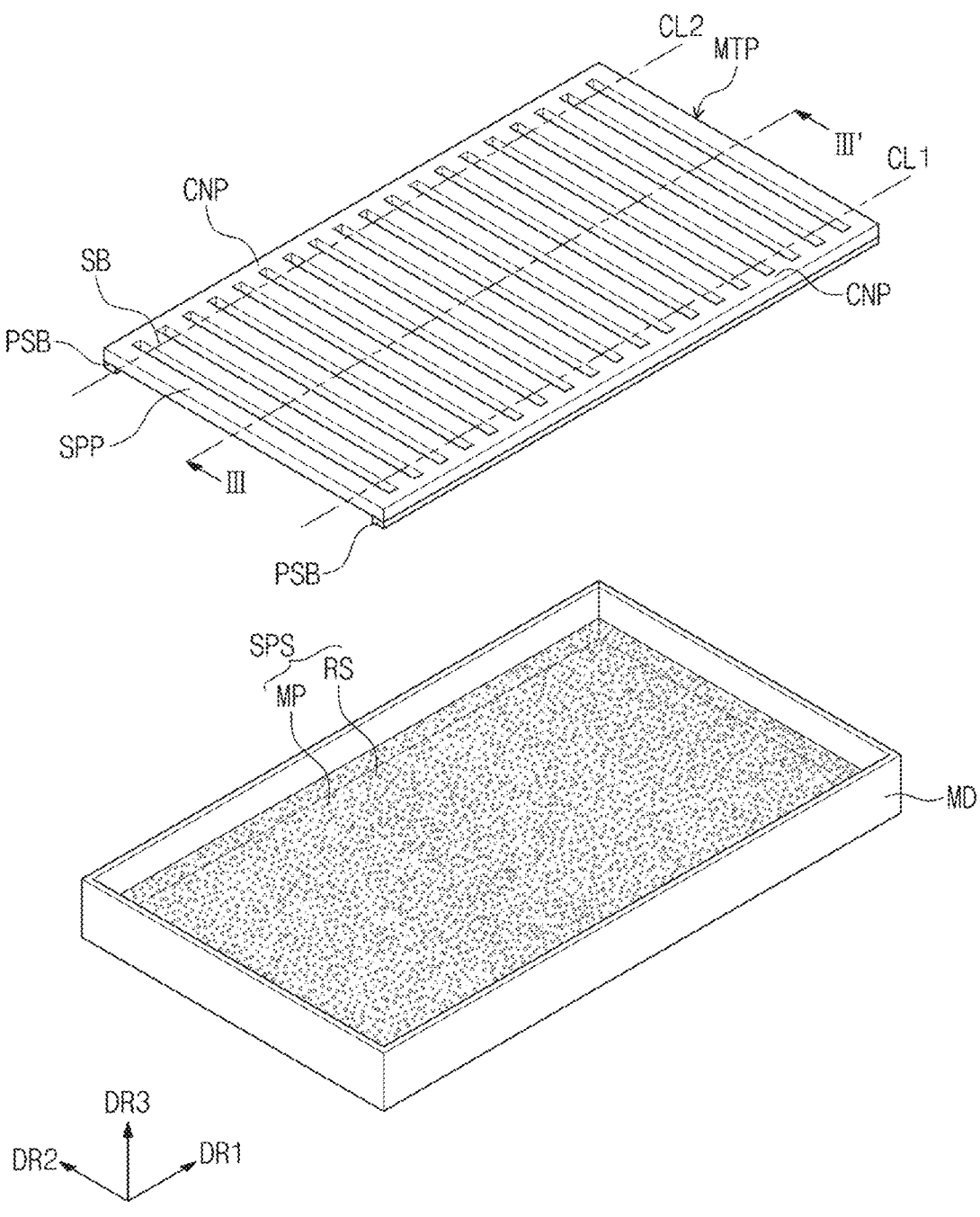

Particularly, FIGS. 16A, 16B, and 16G are illustrated as perspective views, and FIGS. 16C, 16D, 16E, and 16F are cross-sectional views taken along line III-III' of FIG. 16B.

Specifically, a support SPP of FIGS. 16A to 16G may include support bars SB, and FIGS. 16A to 16G illustrate a method of manufacturing the module support part MSP of FIGS. 10A and 10B.

Referring to FIG. 16A, an embodiment of the method of manufacturing the module support part MSP illustrated in FIG. 10A may include preparing a mold MD. When viewed on a plane, the mold MD may have a quadrilateral shape defined by the first direction DR1 and the second direction DR2. The mold MD may include four side walls (reference numerals not illustrated) and a bottom portion (reference numeral not illustrated) surrounded by the side walls. An inner space may be defined by the side walls and the bottom portion.

A first nozzle NOZ1 for providing a suspension SPS may be disposed above the mold MD. The first nozzle NOZ1 may provide a suspension SPS to the mold MD. The first nozzle NOZ1 may provide the suspension SPS to the mold MD through a drop-casting method.

The suspension SPS may have low viscosity and high fluidity. The suspension SPS may include a resin RS and particles MP. The resin RS may include a thermosetting or photocurable resin. The particles MP may have magnetic properties. The particles MP may be randomly mixed into the resin RS. The particles MP may be randomly disposed in the inner space of the mold MD.

Figure 16C:
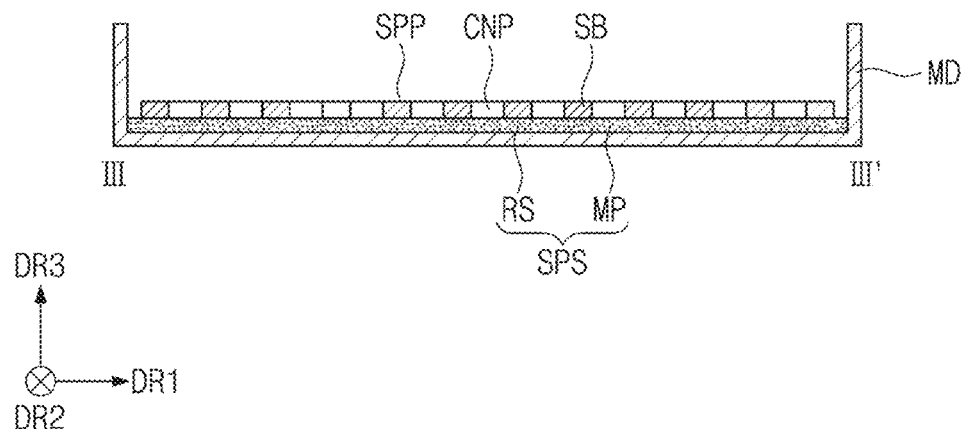

Referring to FIGS. 16B and 16C, a metal plate MTP and plate support portions PSB may be disposed in the mold MD. When viewed on a plane, the metal plate MTP may have a quadrilateral shape defined by the first direction DR1 and the second direction DR2.

The metal plate MTP may include support bars SB, and connection portions CNP. The support bars SB may be arranged in the first direction DR1 and extend in the second direction DR2. The connection portions CNP may extend in the first direction DR1 from opposing ends, opposed to each other in the second direction DR2, of the support bars SB. In an embodiment, for example, the support bars SB and the connection portions CNP may be integrally formed with each other as a single unitary and indivisible part.

The plate support portions PSB may be disposed under the metal plate MTP. The plate support portions PSB may be respectively disposed under the corresponding connection portion CNP among the connection portions CNP. The plate support portions PSB may support the metal plate MTP. The plate support portions PSB may extend in the first direction DR1. The plate support portions PSB may be spaced apart from each other in the second direction DR2.

Cutting lines CL1 and CL2 may be disposed or defined between the plate support portions PSB and respectively be adjacent to the plate support portions PSB. The cutting lines CL1 and CL2 may extend in the first direction DR1 and be opposed to each other in the second direction DR2.

The suspension SPS may be disposed below the support bars SB and the connection portions CNP. The suspension SPS may be filled lower than the support bars SB and the connection portions CNP. The particles MP may be randomly disposed below the support bars SB and the connection portions CNP.

Figure 16D:
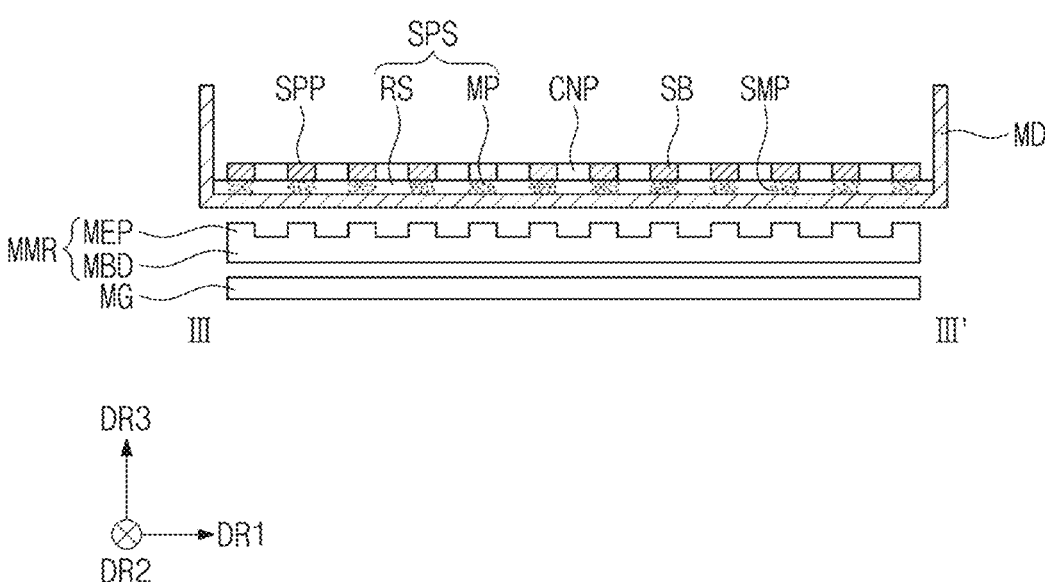

Referring to FIG. 16D, a magnetic field modulator MMR may be disposed below the mold MD, the suspension SPS, and the support bars SB. The magnetic field modulator MMR may include a body portion MBD and a plurality of projection portions MEP. When viewed in the second direction DR2, the body portion MBD may have a quadrilateral shape defined by the first direction DR1 and the third direction DR3.

The projection portions MEP may protrude from the body portion MBD in the third direction DR3. The projection portions MEP may extend from the body portion MBD toward the suspension SPS and the support bars SB in the third direction DR3. The body portion MBD and the projection portions MEP may be integrally formed with each other as a single unitary and indivisible part. Although not illustrated, the projection portions MEP may extend in the second direction DR2. Accordingly, the projection portions MEP may overlap the support bars SB. The projection portions MEP may respectively overlap the corresponding support bars SB among the support bars SB.

A magnet MG may be disposed below the magnetic field modulator MMR. The magnet MG may be disposed to be adjacent to the magnetic field modulator MMR. When the magnet MG becomes adjacent to the magnetic field modulator MMR, the magnetic field of the magnet MG may be concentrated on the projection portions MEP of the magnetic field modulator MMR. When the magnetic field of the magnet MG is concentrated on the projection portions MEP, the magnetic field may be applied to the suspension SPS. The magnetic field applied to the suspension SPS may cause the particles MP to be aligned. The particles MP may be aligned over the projection portions MEP facing the support bars SB. The particles MP may be aligned to overlap the support bars SB. As the particles MP are aligned, the magnetic particle layer SMP may be formed. The density of the particles MP disposed in a portion of the magnetic particle layer SMP under the support bars SB may be greater than the density of the particles MP disposed in a portion of the magnetic particle layer SMP between the support bars SB adjacent to each other.

Although not illustrated, after the particles MP are aligned, the suspension SPS may be cured. The suspension SPS may be cured through heat or ultraviolet light. The cured suspension SPS may be defined as a portion of the support layer SPL.

Figure 16E:
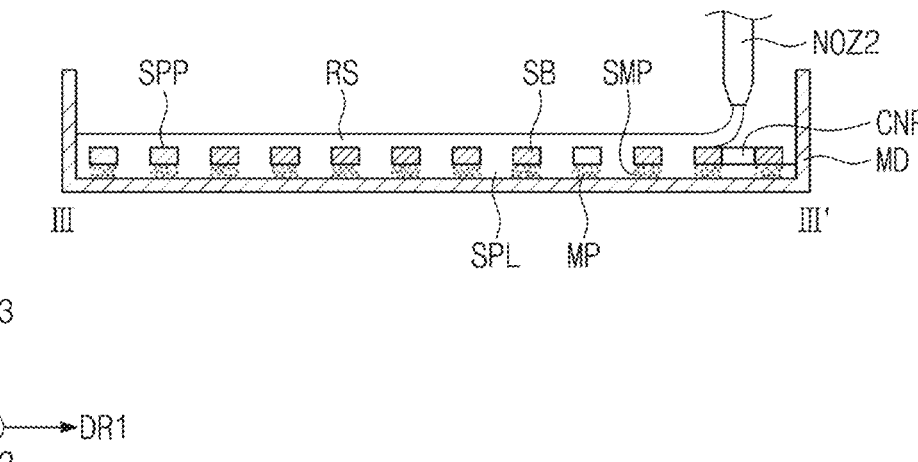
Figure 16F:
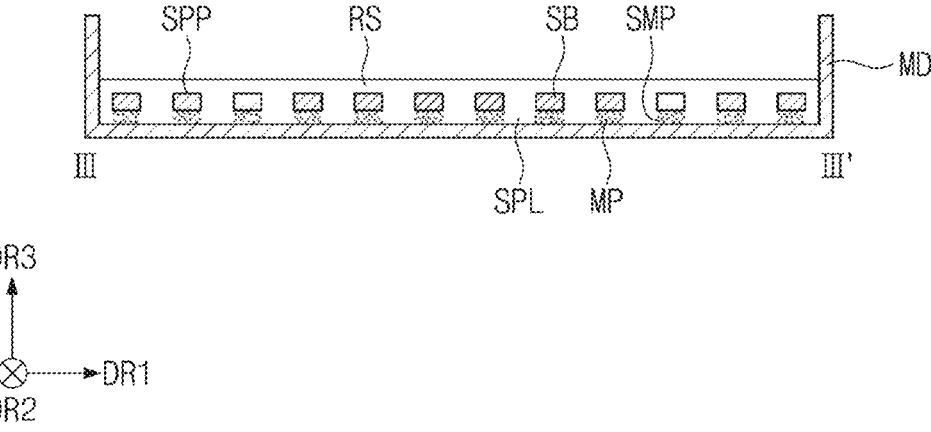
Figure 16G:
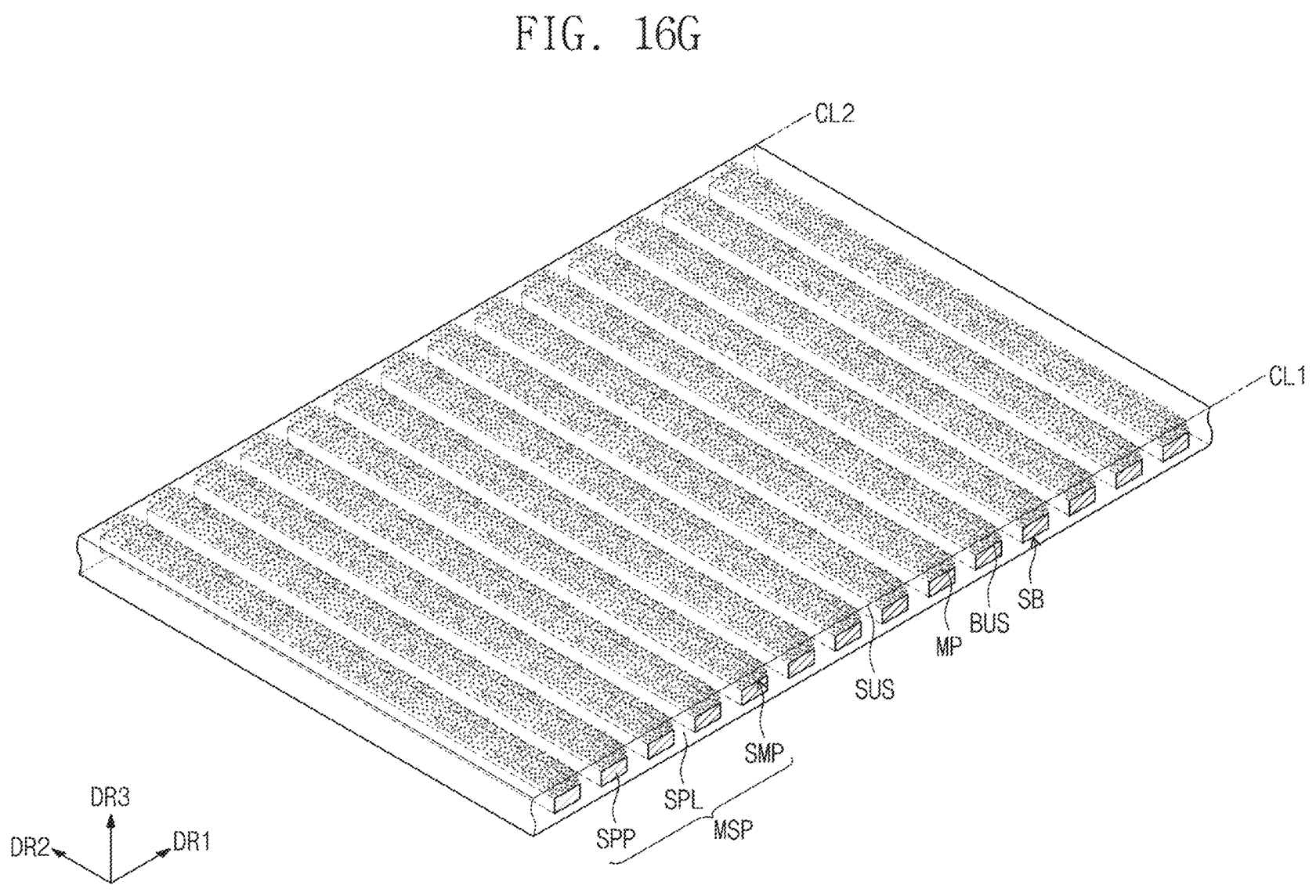

Referring to FIGS. 16E and 16F, a second nozzle NOZ2 may be disposed over the support bars SB. The second nozzle NOZ2 may provide the resin RS in the mold MD. The second nozzle NOZ2 may provide the resin RS on the support bars SB. The resin RS may be filled between the support bars SB adjacent to each other. The resin RS may be filled higher than (or to cover) the support bars SB and the connection portions CNP. Accordingly, the support bars SB and the connection portions CNP may be immersed in the suspension SPS.

Although not illustrated, after the resin RS is provided, the resin RS may be cured. The resin RS may be cured through heat or ultraviolet light. The cured resin RS may be defined as the support layer SPL.

Although not illustrated, after the resin RS is cured, the magnetic particle layer SMP, the support layer SPL, and the support bars SB may be cut along the cutting lines CL1 and CL2, of FIG. 16B, respectively adjacent to both plate support portions PSB. Thus, the module support part MSP of FIG. 16G may be manufactured.

Although not illustrated, when the particles MP are not aligned by the magnet MG and the magnetic field modulator MMR of FIG. 16D and the suspension SPS and the resin RS are cured, the module support part MSP according to another embodiment illustrated in FIG. 11A may be manufactured. In addition, when the projection portions MEP of the magnetic field modulator MMR of FIG. 16D overlap between the support bars SB adjacent to each other, the module support part MSP according to another embodiment illustrated in FIG. 11B may be manufactured.

FIGS. 17A to 17F are views illustrating a method of manufacturing a module support part according to an alternative embodiment of the invention.

Particularly, FIGS. 17A to 17F are illustrated as perspective views. FIGS. 17B to 17E are cross-sectional views taken along line IV-IV' in FIG. 17A.

FIGS. 17A to 17F shows an embodiment of a support SPP including support bars SB.

A mold MD, plate support portions PSB, a metal plate MTP, a suspension SPS, a magnetic field modulator MMR, and a magnet MG of FIGS. 17A to 17F may be the same as the mold MD, the plate support portions PSB, the metal plate MTP, the suspension SPS, the magnetic field modulator MMR, and the magnet MG of FIGS. 16A to 16G, and thus, any repetitive detailed description thereof will be omitted or simplified.

Figure 17A:
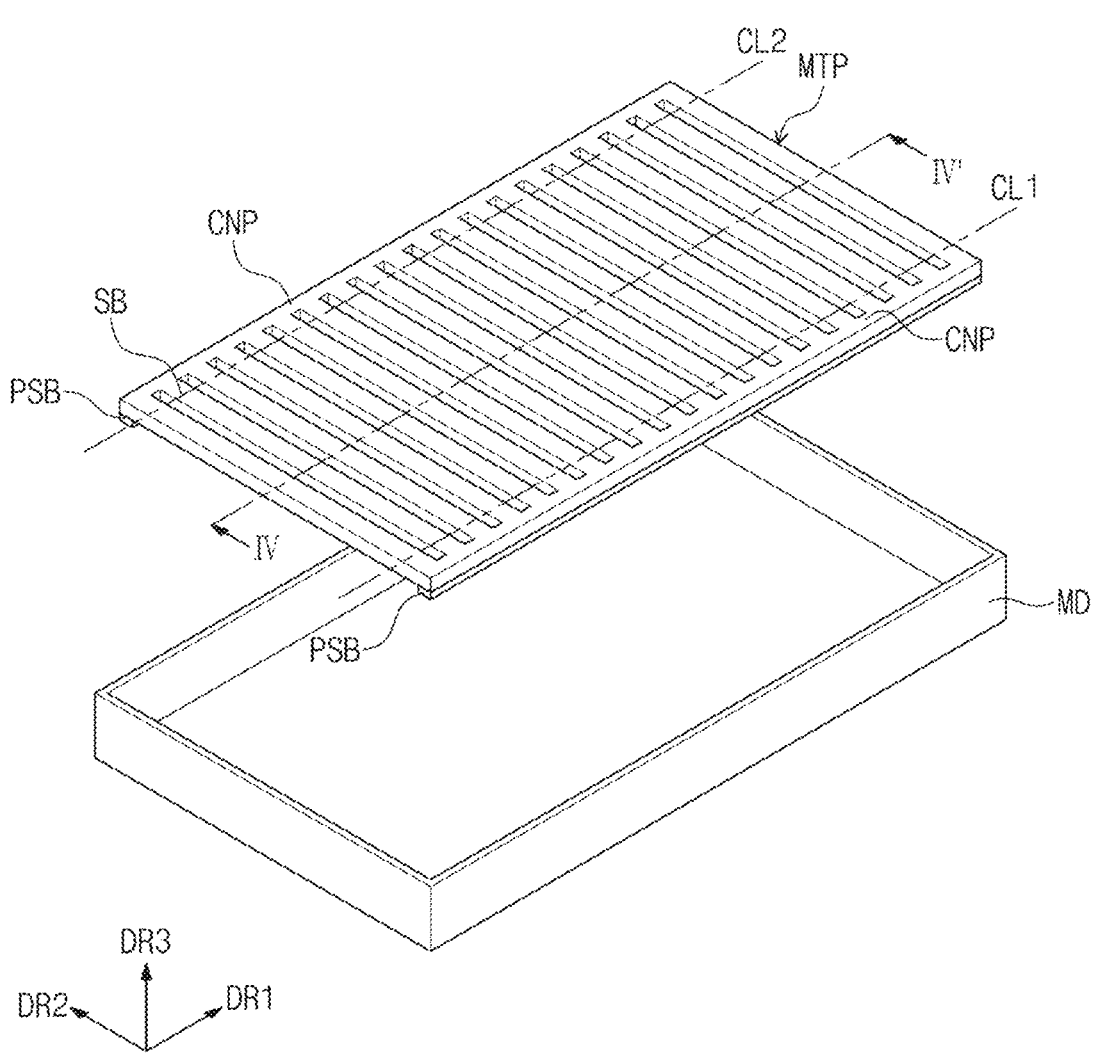

Referring to FIG. 17A, an embodiment of the method of manufacturing a module support part MSP may include preparing the support SPP. In an embodiment, for example, the metal plate MTP including the plate support portions PSB, the support bars SB, and connection portions CNP may be prepared.

The two plate support portions PSB which extend in the first direction DR1 and are spaced apart from each other in the second direction DR2 may be disposed under support bars SB. The mold MD may be prepared in order to dispose the metal plate MTP and the plate support portions PSB.

Cutting lines CL1 and CL2 may be disposed or defined between the plate support portions PSB and be respectively adjacent to the plate support portions PSB. The cutting lines CL1 and CL2 may extend in the first direction DR1 and be opposed to each other in the second direction DR2.

Figure 17B:
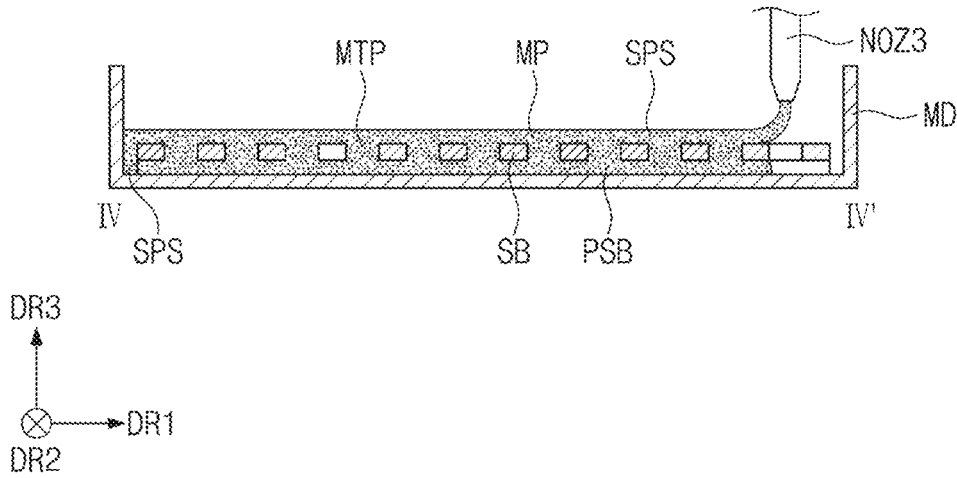
Figure 17C:
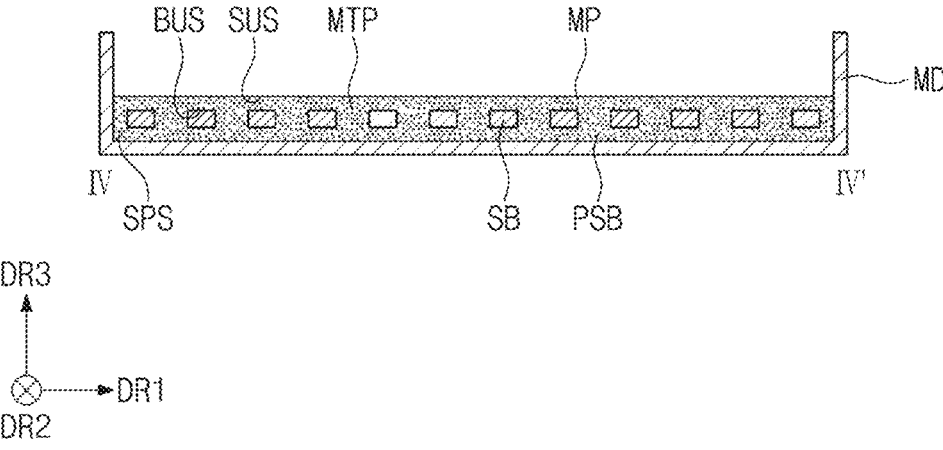

Referring to FIGS. 17B and 17C, the metal plate MTP and the plate support portions PSB may be disposed in the mold MD. A third nozzle NOZ3 may be disposed over the mold MD and the metal plate MTP. The third nozzle NOZ3 may provide the suspension SPS in the mold MD and on top of the metal plate MTP. The suspension SPS may be defined as a flowable resin for forming the support layer SPL. The suspension SPS may include a thermosetting or photocurable resin. The suspension SPS may include particles MP having magnetic properties.

The suspension SPS may be provided to the metal plate MTP. The particles MP may be randomly distributed in the suspension SPS and on the support bars SB. The suspension SPS may be filled higher than (or to cover) the metal plate MTP. Accordingly, the metal plate MTP may be immersed in the suspension SPS. The suspension SPS may have low viscosity and high fluidity to be easily permeated between the support bars SB.

Figure 17D:
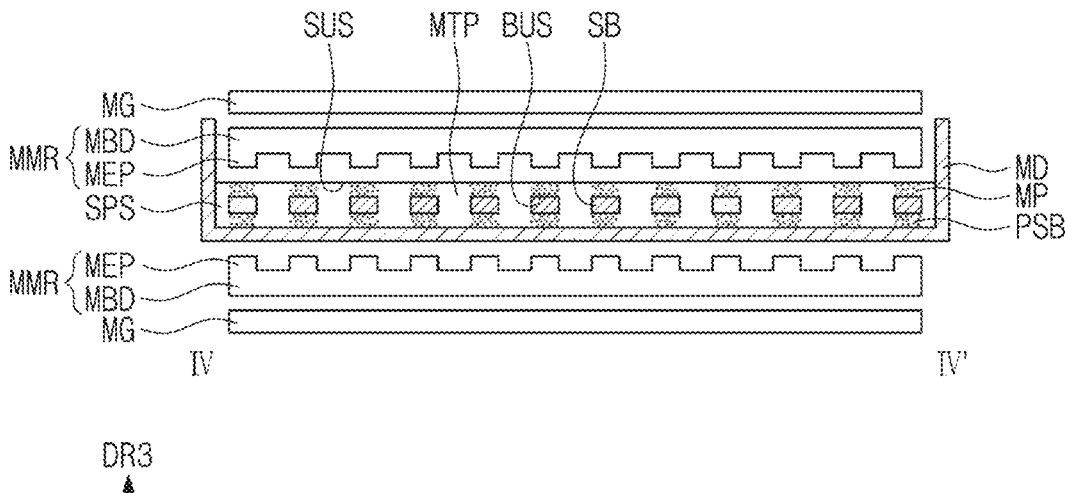

Referring to FIG. 17D, one magnetic field modulator MMR of the two magnetic field modulators MMR may be disposed over the suspension SPS, the support bars SB, and the particles MP. The other magnetic field modulator MMR of the two magnetic field modulators MMR may be disposed below the suspension SPS, the support bars SB, and the particles MP. The magnetic field modulators MMR may be disposed over and/or below the suspension SPS.

The magnetic field modulators MMR may include a body portion MBD and a plurality of projection portions MEP.

The projection portions MEP may be formed to be projected from the body portion MBD in the third direction DR3. The projection portions MEP may extend toward the suspension SPS and the support bars SB in the third direction DR3. The projection portions MEP may be arranged in the first direction DR1. Although not illustrated, the projection portions MEP may extend in the second direction DR2. When viewed on a plane, the projection portions MEP may be arranged to overlap the support bars SB. The projection portions MEP may respectively face the corresponding support bars SB among the support bars SB.

Magnets MG may be disposed on an upper part of the magnetic field modulators MMR. The upper part of the magnetic field modulators MMR may be defined as a surface opposed to the surface facing the suspension SPS. The magnets MG may be disposed to be adjacent to the magnetic field modulators MMR. When the magnets MG are disposed on an upper part of the magnetic field modulators MMR, the magnetic field of the magnet MG may be concentrated on the projection portions MEP of the magnetic field modulator MMR. The magnetic field may be applied to the suspension SPS in which the support SPP is immersed. When the magnetic field is concentrated on the projection portions MEP of the magnetic field modulator MMR, the particles MP having magnetic properties may be aligned by the magnetic field.

The particles MP may be aligned to overlap the support bars SB by the projection portions MEP facing the support bars SB. The particles MP may be disposed on top of and under (on an upper surface and a lower surface of) the support bars SB. When viewed on a plane, the density of the particles MP in a portion of the magnetic particle layer SMP overlapping the support bars SB may be greater than the density of the particles MP disposed in a portion of the magnetic particle layer SMP between the support bars SB. The particles MP are aligned on top of and under the support bars SB, and thus, the plurality of magnetic particle layers SMP, illustrated in FIG. 10A, which are arranged in the first direction DR1 and extend in the second direction DR2 may be formed.

Figure 17E:
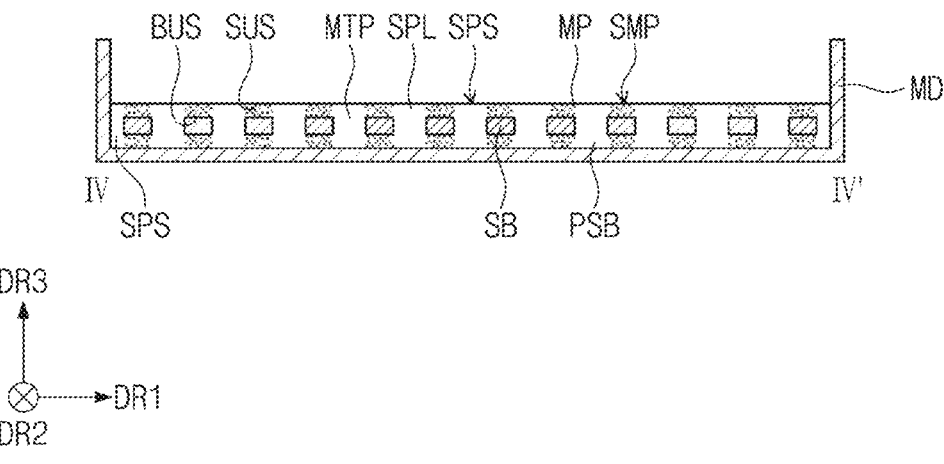
Figure 17F:
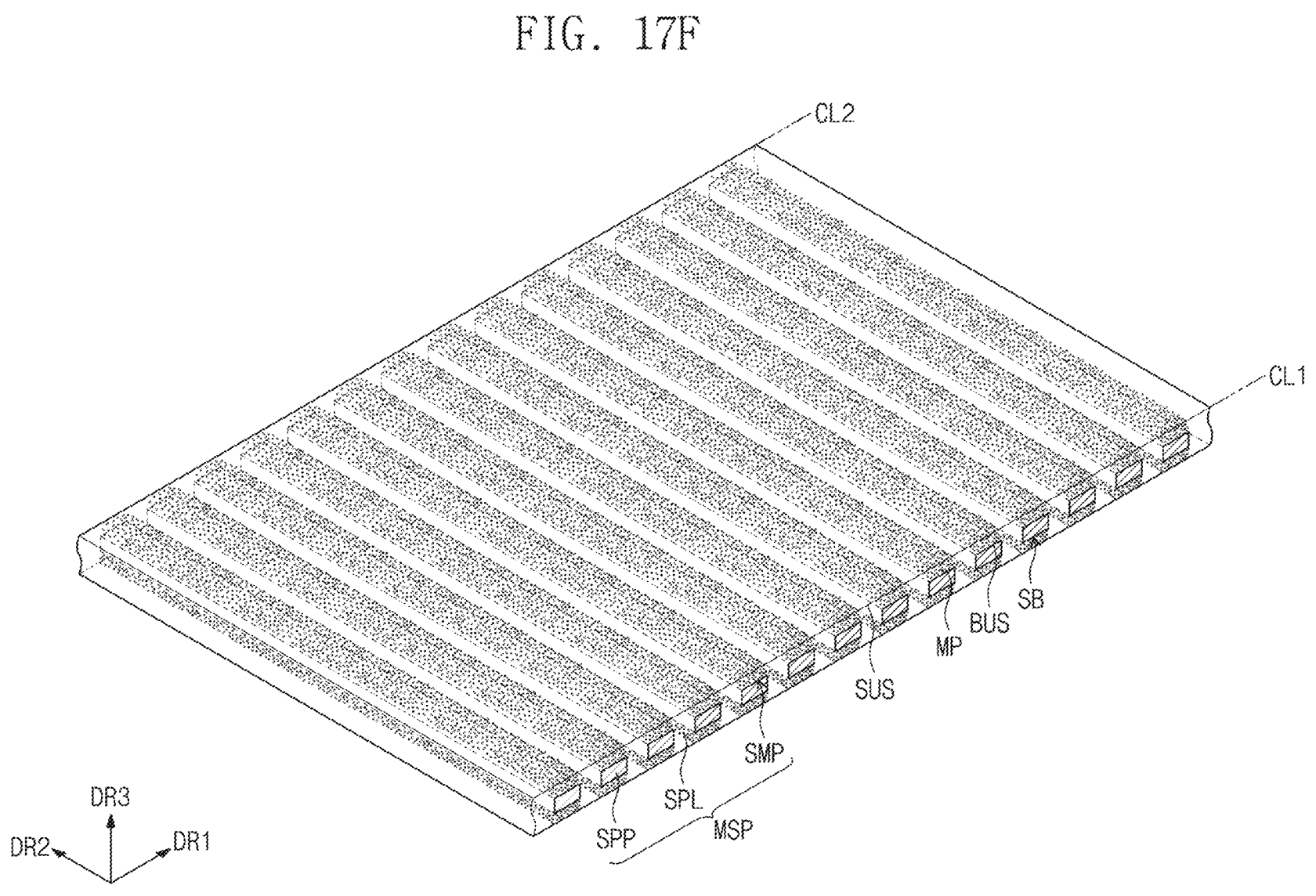

Referring to FIGS. 17E and 17F, the suspension SPS is cured and then, the support layer SPL may be formed. The suspension SPS may be cured through heat or ultraviolet light. After the support layer SPL is formed, the support bars SB, the magnetic particle layer SMP, and the support layer SPL may be cut along the cutting lines CL1 and CL2 respectively adjacent to both plate support portions PSB. The module support part MSP illustrated in FIG. 11C according to an embodiment of the invention may be manufactured from the support bars SB, the magnetic particle layer SMP, and the support layer SPL which are cut along the cutting lines.

FIGS. 18A to 18D are views illustrating support bars according to various embodiments of the invention.

For ease of description, only a portion of a module support part MSP is illustrated in FIGS. 18A to 18D.

Referring to FIG. 18A, in an embodiment, a module support part MSP_1 may include a support layer SPL, and a plurality of support bars SB_1 having a T-shape in a cross-section or when viewed in the second direction DR2. The shape of the support bars SB_1 may extend on a plane defined by the first direction DR1 and the second direction DR2 and extend in the first direction DR1 and the third direction DR3 from the plane toward a lower surface of the module support part MSP_1. The support bars SB_1 may be arranged in the first direction and extend in the second direction DR2.

Referring to FIG. 18B, in an alternative embodiment, a module support part MSP_2 may include the support layer SPL, and a plurality of support bars SB_2 having an inverted triangle shape in a cross-section or when viewed in the second direction DR2. The support bars SB_2 may be arranged in the first direction DR1 and extend in the second direction DR2.

Referring to FIG. 18C, in another alternative embodiment, a module support part MSP_3 may include the support layer SPL, and a plurality of support bars SB_3 having an inverted triangle shape in which two sides symmetrical with respect to the first direction DR1 are concave in a cross-section or when viewed in the second direction DR2. The support bars SB_3 may be arranged in the first direction DR1 and extend in the second direction DR2.

Referring to FIG. 18D, in an alternative embodiment, a module support part MSP_4 may include the support layer SPL, and a plurality of support bars SB_4 having an inverted trapezoid shape in a cross-section or when viewed in the second direction DR2. The support bars SB_4 may be arranged in the first direction DR1 and extend in the second direction DR2.

According to embodiments of the invention, as described above, since a magnetic particle layer is disposed in a module support part, the module support part may be effectively prevented from deformation caused by an impact and thus the surface quality of a display module may be improved. In such embodiments, since the magnetic particle layer includes particles having magnetic properties, static electricity generated on a surface of the display module may be discharged through the magnetic particle layer, thereby protecting the display module against static electricity.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display module; and
a module support part disposed on one surface of the display module,
wherein the module support part includes:
a support layer disposed on the one surface of the display module;
a support disposed in the support layer and having greater rigidity than the support layer; and
a magnetic particle layer disposed in the support layer and disposed on a top surface or a bottom surface of the support in the support layer.

2. The display device of claim 1, wherein
the magnetic particle layer comprises a plurality of magnetic particle patterns, and
the support comprises a plurality of support bars arranged in a first direction and extending in a second direction intersecting the first direction.

3. The display device of claim 2, wherein the plurality of magnetic particle patterns are each comprise a plurality of particles having magnetic properties.

4. The display device of claim 3, wherein the plurality of particles have a size in a range of about 500 nanometers to about 10 micrometers.

5. The display device of claim 3, wherein the plurality of particles comprise iron, cobalt, nickel, iron oxide, chromium oxide, or ferrite.

6. The display device of claim 3, wherein the magnetic particle layer is disposed on a top surface of each of the plurality of support bars.

7. The display device of claim 6, wherein when viewed on a plane, a density of the plurality of particles disposed in a portion of the magnetic particle layer between two support bars adjacent to each other, among the plurality of support bars, is less than a density of the plurality of particles disposed in a portion of the support layer on one surface of each of the plurality of support bars.

8. The display device of claim 7, wherein in the first direction, an interval between two support bars adjacent to each other, among the plurality of support bars, is in a range of about 100 micrometers to about 200 micrometers.

9. The display device of claim 6, wherein when viewed on a plane, a density of the plurality of particles disposed in a portion of the magnetic particle layer between two support bars adjacent to each other, among the plurality of support bars, is the same as a density of the plurality of particles disposed in a portion of the support layer on one surface of each of the plurality of support bars.

10. The display device of claim 6, wherein when viewed on a plane, a density of the plurality of particles disposed in a portion of the magnetic particle layer between two support bars adjacent to each other, among the plurality of support bars, is greater than a density of the plurality of particles disposed in a portion of the magnetic particle layer on one surface of each of the plurality of support bars.

11. The display device of claim 10, wherein in the first direction, an interval between two support bars adjacent to each other, among the plurality of support bars, is in a range of about 500 micrometers to about 1 millimeter.

12. The display device of claim 6, wherein the magnetic particle layer is further disposed on a bottom surface of each of the plurality of support bars.

13. The display device of claim 2, wherein when viewed in the second direction, each of the plurality of support bars has a cross-sectional shape of a quadrangle, a T-shape, an inverted triangle, an inverted trapezoid, or an inverted triangle having two concave sides symmetrical with respect to the first direction.

14. The display device of claim 1, wherein
the magnetic particle layer comprises a plurality of magnetic particle patterns,
the support comprises a support plate in which a plurality of openings arranged in a first direction and a second direction crossing the first direction are defined, and
the support plate includes a plurality of first branch portions arranged between the plurality of openings adjacent to each other in the first direction and a plurality of second branch portions arranged between the plurality of openings adjacent to each other in the second direction.

15. The display device of claim 14, wherein
the magnetic particle layer is disposed on a top surface of the support plate, and
the plurality of magnetic particle patterns each comprise a plurality of particles having magnetic properties.

16. The display device of claim 15, wherein when viewed on a plane, a density of the plurality of particles disposed in a portion of the magnetic particle layer on the plurality of first branch portions and the plurality of second branch portions is greater than a density of the plurality of particles disposed in a portion of the magnetic particle layer on the plurality of openings.

17. The display device of claim 15, wherein when viewed on a plane, the plurality of particles disposed in a portion of the magnetic particle layer on the plurality of openings is the same as a density of the plurality of particles disposed in a portion of the magnetic particle layer on the plurality of first branch portions and the plurality of second branch portions.

18. The display device of claim 15, wherein when viewed on a plane, the plurality of particles disposed in a portion of the magnetic particle layer on the plurality of openings is greater than a density of the plurality of particles disposed in a portion of the magnetic particle layer on the plurality of first branch portions and the plurality of second branch portions.

19. The display device of claim 15, wherein the magnetic particle layer is further disposed on a bottom surface of the support plate.

20. An electronic device for providing an image, the electronic device comprising:
a display device comprising:
a display module; and
a module support part disposed on one surface of the display module,
wherein the module support part includes:
a support layer disposed on the one surface of the display module;
a support disposed in the support layer and having greater rigidity than the support layer; and
a magnetic particle layer disposed in the support layer and disposed on a top surface or a bottom surface of the support in the support layer.

* * * * *